US008537925B2

(12) United States Patent
Levi et al.

(10) Patent No.: US 8,537,925 B2
(45) Date of Patent: Sep. 17, 2013

(54) APPARATUS AND METHODS FOR COMPENSATING FOR SIGNAL IMBALANCE IN A RECEIVER

(75) Inventors: Zak Levi, Ramat HaSharon (IL); Eliyahu Shusterman, Kfar-Saba (IL)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/252,385

(22) Filed: Oct. 4, 2011

(65) Prior Publication Data
US 2012/0093244 A1  Apr. 19, 2012

Related U.S. Application Data

(62) Division of application No. 11/938,848, filed on Nov. 13, 2007, now Pat. No. 8,090,043.

(60) Provisional application No. 60/866,532, filed on Nov. 20, 2006, provisional application No. 60/866,527, filed on Nov. 20, 2006, provisional application No. 60/866,519, filed on Nov. 20, 2006, provisional application No. 60/907,111, filed on Mar. 21, 2007, provisional application No. 60/907,126, filed on Mar. 22, 2007, provisional application No. 60/907,819, filed on Apr. 18, 2007, provisional application No. 60/940,998, filed on May 31, 2007.

(51) Int. Cl.
*H04B 7/02* (2006.01)
(52) U.S. Cl.
USPC .......................................... 375/267

(58) Field of Classification Search
USPC ............... 370/208; 375/147, 267, 316, 344, 375/350, 355; 455/517, 522
See application file for complete search history.

(56) References Cited

U.S. PATENT DOCUMENTS

| 3,836,888 A | 9/1974 | Boenke et al. |
| 4,413,229 A | 11/1983 | Grant |
| 4,536,875 A | 8/1985 | Kume et al. |
| 4,608,685 A | 8/1986 | Jain et al. |
| 4,893,326 A | 1/1990 | Duran et al. |

(Continued)

FOREIGN PATENT DOCUMENTS

| CN | 1422043 | 6/2003 |
| CN | 1588827 | 8/2004 |

(Continued)

OTHER PUBLICATIONS

International Search Report for International Application No. PCT/US03/27253 dated Dec. 30, 2003 (4 pgs).

(Continued)

*Primary Examiner* — Leon-Viet Nguyen
(74) *Attorney, Agent, or Firm* — McDermott Will & Emery LLP

(57) ABSTRACT

Apparatus, methods and systems for compensating for an I/Q imbalance may include compensating for an imbalance between a first component of a data signal and a second component of the data signal. The data signal may be modulated by a carrier signal having a frequency error. The first component may be characterized by at least one parameter. The method may include receiving the data and carrier signals; selecting a value for the parameter such that the frequency domain energy at negative frequencies is reduced; and modifying at least one of the components based on the value.

11 Claims, 22 Drawing Sheets

(56) References Cited

U.S. PATENT DOCUMENTS

| | | |
|---|---|---|
| 5,052,029 A | 9/1991 | James et al. |
| 5,170,415 A | 12/1992 | Yoshida et al. |
| 5,343,240 A | 8/1994 | Yu |
| 5,421,030 A | 5/1995 | Baran |
| 5,440,335 A | 8/1995 | Beveridge |
| 5,570,355 A | 10/1996 | Dail et al. |
| 5,638,374 A | 6/1997 | Heath |
| 5,671,220 A | 9/1997 | Tonomura |
| 5,796,739 A | 8/1998 | Kim et al. |
| 5,802,173 A | 9/1998 | Hamilton-Piercy et al. |
| 5,805,591 A | 9/1998 | Naboulsi et al. |
| 5,805,806 A | 9/1998 | McArthur |
| 5,815,662 A | 9/1998 | Ong |
| 5,822,677 A | 10/1998 | Peyrovian |
| 5,822,678 A | 10/1998 | Evanyk |
| 5,845,190 A | 12/1998 | Bushue et al. |
| 5,850,400 A | 12/1998 | Eames et al. |
| 5,854,887 A | 12/1998 | Kindell et al. |
| 5,856,975 A | 1/1999 | Rostoker et al. |
| 5,877,821 A | 3/1999 | Newlin et al. |
| 5,886,732 A | 3/1999 | Humpleman |
| 5,896,556 A | 4/1999 | Moreland et al. |
| 5,917,624 A | 6/1999 | Wagner |
| 5,930,493 A | 7/1999 | Ottesen et al. |
| 5,963,844 A | 10/1999 | Dail |
| 5,982,784 A | 11/1999 | Bell |
| 6,009,465 A | 12/1999 | Decker et al. |
| 6,028,860 A | 2/2000 | Laubach et al. |
| 6,055,242 A | 4/2000 | Doshi et al. |
| 6,069,588 A | 5/2000 | O'Neill, Jr. |
| 6,081,519 A | 6/2000 | Petler |
| 6,081,533 A | 6/2000 | Laubach et al. |
| 6,111,911 A | 8/2000 | Sanderford, Jr. et al. |
| 6,118,762 A | 9/2000 | Nomura et al. |
| 6,157,645 A | 12/2000 | Shobatake |
| 6,167,120 A | 12/2000 | Kikinis |
| 6,192,070 B1 | 2/2001 | Poon et al. |
| 6,219,409 B1 | 4/2001 | Smith et al. |
| 6,229,818 B1 | 5/2001 | Bell |
| 6,243,413 B1 | 6/2001 | Beukema |
| 6,304,552 B1 | 10/2001 | Chapman et al. |
| 6,307,862 B1 | 10/2001 | Silverman |
| 6,434,151 B1 | 8/2002 | Caves et al. |
| 6,466,651 B1 | 10/2002 | Dailey |
| 6,481,013 B1 | 11/2002 | Dinwiddie et al. |
| 6,526,070 B1 | 2/2003 | Bernath et al. |
| 6,553,568 B1 | 4/2003 | Fijolek et al. |
| 6,563,829 B1 | 5/2003 | Lyles et al. |
| 6,567,654 B1 | 5/2003 | Coronel Arredondo et al. |
| 6,611,537 B1 | 8/2003 | Edens et al. |
| 6,622,304 B1 | 9/2003 | Carhart |
| 6,637,030 B1 | 10/2003 | Klein |
| 6,650,624 B1 | 11/2003 | Quigley et al. |
| 6,745,392 B1 | 6/2004 | Basawapatna et al. |
| 6,763,032 B1 | 7/2004 | Rabenko et al. |
| 6,785,296 B1 | 8/2004 | Bell |
| 6,816,500 B1 | 11/2004 | Mannette et al. |
| 6,831,899 B1 | 12/2004 | Roy |
| 6,836,515 B1 | 12/2004 | Kay et al. |
| 6,859,899 B2 | 2/2005 | Shalvi et al. |
| 6,862,270 B1 | 3/2005 | Ho |
| 6,877,043 B2 | 4/2005 | Mallory et al. |
| 6,877,166 B1 | 4/2005 | Roeck et al. |
| 6,898,210 B1 | 5/2005 | Cheng et al. |
| 6,930,989 B1 | 8/2005 | Jones, IV et al. |
| 6,940,833 B2 | 9/2005 | Jonas et al. |
| 6,950,399 B1 | 9/2005 | Bushmitch et al. |
| 6,961,314 B1 | 11/2005 | Quigley et al. |
| 6,985,437 B1 | 1/2006 | Vogel |
| 7,035,270 B2 | 4/2006 | Moore, Jr. et al. |
| 7,065,779 B1 | 6/2006 | Crocker et al. |
| 7,089,580 B1 | 8/2006 | Vogel et al. |
| 7,116,685 B2 | 10/2006 | Brown et al. |
| 7,127,734 B1 | 10/2006 | Amit |
| 7,133,697 B2 | 11/2006 | Judd et al. |
| 7,142,553 B1 | 11/2006 | Ojard et al. |
| 7,146,632 B2 | 12/2006 | Miller |
| 7,149,220 B2 | 12/2006 | Beukema et al. |
| 7,296,083 B2 | 11/2007 | Barham et al. |
| 7,327,754 B2 | 2/2008 | Mills et al. |
| 7,372,853 B2 | 5/2008 | Sharma et al. |
| 7,460,543 B2 | 12/2008 | Malik et al. |
| 7,487,532 B2 | 2/2009 | Robertson et al. |
| 7,532,642 B1 | 5/2009 | Peacock |
| 7,532,693 B1 | 5/2009 | Narasimhan |
| 7,555,064 B2 | 6/2009 | Beadle |
| 7,574,615 B2 | 8/2009 | Weng et al. |
| 7,606,256 B2 | 10/2009 | Vitebsky et al. |
| 7,652,527 B2 | 1/2010 | Ido et al. |
| 7,653,164 B2 * | 1/2010 | Lin et al. .................. 375/350 |
| 7,664,065 B2 | 2/2010 | Lu |
| 7,675,970 B2 | 3/2010 | Nemiroff et al. |
| 7,697,522 B2 | 4/2010 | Kliger et al. |
| 7,742,495 B2 | 6/2010 | Kliger et al. |
| 7,782,850 B2 | 8/2010 | Kliger et al. |
| 7,783,259 B2 | 8/2010 | Dessert et al. |
| 7,817,642 B2 | 10/2010 | Ma et al. |
| 7,856,048 B1 | 12/2010 | Smaini et al. |
| 7,860,092 B2 | 12/2010 | Yoon et al. |
| 7,916,756 B2 | 3/2011 | Atsumi et al. |
| 8,090,043 B2 | 1/2012 | Levi et al. |
| 8,098,770 B2 | 1/2012 | Shusterman |
| 8,174,999 B2 | 5/2012 | Kliger et al. |
| 8,184,550 B2 | 5/2012 | Beck et al. |
| 2001/0039660 A1 | 11/2001 | Vasilevsky et al. |
| 2002/0010562 A1 | 1/2002 | Schleiss et al. |
| 2002/0059623 A1 | 5/2002 | Rodriguez et al. |
| 2002/0059634 A1 | 5/2002 | Terry et al. |
| 2002/0069417 A1 | 6/2002 | Kliger et al. |
| 2002/0078247 A1 | 6/2002 | Lu et al. |
| 2002/0078249 A1 | 6/2002 | Lu et al. |
| 2002/0085654 A1 * | 7/2002 | Cvetkovic .................. 375/350 |
| 2002/0097821 A1 | 7/2002 | Hebron et al. |
| 2002/0105970 A1 | 8/2002 | Shvodian |
| 2002/0136231 A1 | 9/2002 | Leatherbury et al. |
| 2002/0141347 A1 | 10/2002 | Harp et al. |
| 2002/0150155 A1 | 10/2002 | Florentin et al. |
| 2002/0166124 A1 | 11/2002 | Gurantz et al. |
| 2002/0174423 A1 | 11/2002 | Fifield et al. |
| 2002/0194605 A1 | 12/2002 | Cohen et al. |
| 2003/0013453 A1 | 1/2003 | Lavaud et al. |
| 2003/0016751 A1 | 1/2003 | Vetro et al. |
| 2003/0022683 A1 | 1/2003 | Beckmann et al. |
| 2003/0060207 A1 | 3/2003 | Sugaya et al. |
| 2003/0063563 A1 | 4/2003 | Kowalski |
| 2003/0066082 A1 | 4/2003 | Kliger et al. |
| 2003/0099253 A1 | 5/2003 | Kim |
| 2003/0152059 A1 | 8/2003 | Odman |
| 2003/0169769 A1 | 9/2003 | Ho et al. |
| 2003/0193619 A1 | 10/2003 | Farrand |
| 2003/0198244 A1 | 10/2003 | Ho et al. |
| 2004/0004934 A1 | 1/2004 | Zhu et al. |
| 2004/0037366 A1 * | 2/2004 | Crawford .................. 375/295 |
| 2004/0047284 A1 | 3/2004 | Eidson |
| 2004/0066857 A1 | 4/2004 | Srinivasan et al. |
| 2004/0107445 A1 | 6/2004 | Amit |
| 2004/0163120 A1 | 8/2004 | Rabenko et al. |
| 2004/0172658 A1 | 9/2004 | Rakib et al. |
| 2004/0177381 A1 | 9/2004 | Kliger et al. |
| 2004/0224715 A1 * | 11/2004 | Rosenlof et al. .............. 455/522 |
| 2004/0258062 A1 | 12/2004 | Narvaez |
| 2005/0008092 A1 * | 1/2005 | Kadous .................. 375/267 |
| 2005/0015703 A1 | 1/2005 | Terry et al. |
| 2005/0097196 A1 | 5/2005 | Wronski et al. |
| 2005/0122895 A1 * | 6/2005 | Zhou et al. .................. 370/210 |
| 2005/0152350 A1 | 7/2005 | Sung et al. |
| 2005/0152359 A1 | 7/2005 | Giesberts et al. |
| 2005/0175027 A1 | 8/2005 | Miller et al. |
| 2005/0204066 A9 | 9/2005 | Cohen et al. |
| 2005/0213405 A1 | 9/2005 | Stopler |
| 2006/0059400 A1 | 3/2006 | Clark et al. |
| 2006/0062250 A1 | 3/2006 | Payne, III |
| 2006/0078001 A1 | 4/2006 | Chandra et al. |
| 2006/0104201 A1 | 5/2006 | Sundberg et al. |

| | | |
|---|---|---|
| 2006/0256799 A1 | 11/2006 | Eng |
| 2006/0256818 A1 | 11/2006 | Shvodian et al. |
| 2006/0268934 A1 | 11/2006 | Shimizu et al. |
| 2006/0280194 A1 | 12/2006 | Jang et al. |
| 2007/0025317 A1 | 2/2007 | Bolinth et al. |
| 2007/0040947 A1 | 2/2007 | Koga |
| 2007/0127373 A1 | 6/2007 | Ho et al. |
| 2007/0160213 A1 | 7/2007 | Un et al. |
| 2007/0171919 A1 | 7/2007 | Godman et al. |
| 2007/0183786 A1 | 8/2007 | Hinosugi et al. |
| 2007/0206551 A1 | 9/2007 | Moorti et al. |
| 2007/0217436 A1 | 9/2007 | Markley et al. |
| 2007/0253379 A1 | 11/2007 | Kumar et al. |
| 2007/0286121 A1 | 12/2007 | Kolakowski et al. |
| 2008/0037487 A1 | 2/2008 | Li et al. |
| 2008/0037589 A1 | 2/2008 | Kliger et al. |
| 2008/0080369 A1 | 4/2008 | Sumioka et al. |
| 2008/0089268 A1 | 4/2008 | Kinder et al. |
| 2008/0178229 A1 | 7/2008 | Kliger et al. |
| 2008/0189431 A1 | 8/2008 | Hyslop et al. |
| 2008/0212591 A1 | 9/2008 | Wu et al. |
| 2008/0225832 A1 | 9/2008 | Kaplan et al. |
| 2008/0238016 A1 | 10/2008 | Chen et al. |
| 2008/0271094 A1 | 10/2008 | Kliger et al. |
| 2008/0273591 A1 | 11/2008 | Brooks et al. |
| 2008/0279219 A1 | 11/2008 | Wu et al. |
| 2008/0298241 A1 | 12/2008 | Ohana et al. |
| 2009/0063878 A1 | 3/2009 | Schmidt et al. |
| 2009/0092154 A1 | 4/2009 | Malik et al. |
| 2009/0106801 A1 | 4/2009 | Horii |
| 2009/0122901 A1 | 5/2009 | Choi et al. |
| 2009/0165070 A1 | 6/2009 | McMullin et al. |
| 2009/0252172 A1 | 10/2009 | Hare |
| 2009/0254794 A1 | 10/2009 | Malik et al. |
| 2009/0257483 A1 | 10/2009 | French et al. |
| 2009/0285212 A1 | 11/2009 | Chu et al. |
| 2009/0296578 A1 | 12/2009 | Bernard et al. |
| 2009/0316589 A1* | 12/2009 | Shafeeu ............ 370/252 |
| 2010/0031297 A1 | 2/2010 | Klein et al. |
| 2010/0080312 A1 | 4/2010 | Moffatt et al. |
| 2010/0150016 A1 | 6/2010 | Barr |
| 2010/0158013 A1 | 6/2010 | Kliger et al. |
| 2010/0158015 A1 | 6/2010 | Wu |
| 2010/0158021 A1 | 6/2010 | Kliger et al. |
| 2010/0158022 A1 | 6/2010 | Kliger et al. |
| 2010/0162329 A1 | 6/2010 | Ford et al. |
| 2010/0174824 A1 | 7/2010 | Aloni et al. |
| 2010/0185731 A1 | 7/2010 | Wu |
| 2010/0185759 A1 | 7/2010 | Wu |
| 2010/0238932 A1 | 9/2010 | Kliger et al. |
| 2010/0246586 A1 | 9/2010 | Ohana et al. |
| 2010/0254278 A1 | 10/2010 | Kliger et al. |
| 2010/0254402 A1 | 10/2010 | Kliger et al. |
| 2010/0281195 A1 | 11/2010 | Daniel et al. |
| 2010/0284474 A1 | 11/2010 | Kliger et al. |
| 2010/0290461 A1 | 11/2010 | Kliger et al. |
| 2010/0322134 A1 | 12/2010 | Wu |
| 2011/0001833 A1 | 1/2011 | Grinkemeyer et al. |
| 2011/0013633 A1 | 1/2011 | Klein et al. |
| 2011/0080850 A1 | 4/2011 | Klein et al. |
| 2011/0205891 A1 | 8/2011 | Kliger et al. |
| 2011/0206042 A1 | 8/2011 | Tarrab et al. |
| 2011/0310907 A1 | 12/2011 | Klein et al. |

FOREIGN PATENT DOCUMENTS

| | | |
|---|---|---|
| EP | 0 385695 | 9/1990 |
| EP | 0 622926 | 11/1994 |
| EP | 1501326 | 1/2005 |
| JP | 60160231 | 8/1985 |
| WO | WO 98/27748 | 6/1998 |
| WO | WO 98/31133 | 7/1998 |
| WO | WO 99/35753 | 7/1999 |
| WO | WO 99/46734 | 9/1999 |
| WO | WO 00/31725 | 6/2000 |
| WO | WO 00/55843 | 9/2000 |
| WO | WO 01/80030 | 10/2001 |
| WO | WO 02/019623 | 3/2002 |

OTHER PUBLICATIONS

International Search Report for International Application No. PCT/US03/27254 dated Feb. 3, 2004 (5 pgs).

"MoCA: Ubiquitous Multimedia Networking in the Home, Proc of SPIE vol. 6776 67760C-1", Shlomo Ovadia, SPIE, Bellingham, WA, May 28, 2010.

"MoCA Brewing Up Bigger Bandwidth, CTO Anton Monk Outlines Plans for MoCA 2.0 Home-Networking Specification" (http://www.multichannel.com/article/160878-MoCa_Brewing_Up_bigger_Bandwidth.php), Multichannel News, New York, NY, Dec. 15, 2008.

"Home Networking on Coax for Video and Multimedia, Overview for IEEE 802.1AVB", Shlomo Ovadia, San Ramon, California, May 30, 2007.

"Microtune Introduces Industry's First 1-Ghz Cable Tuners Compatible with MoCA—Home Networking Standard", Business Wire, San Francisco, California, Mar. 19, 2007.

Ellingson, S.W., "Correcting I-Q Imbalance in Direct Conversion Receivers", ElectroScience Laboratory, Ohio State University, Columbus, Ohio, Feb. 10, 2003.

Parot, Ron, et al., "Resolving and Correcting Gain and Phase Mismatch in Transmitters and Receivers for Wideband OFDM Systems," in Pacific Groove, California on Nov. 3-6, 2002.

European Search Report for European Patent application No. 07022243, Oct. 4, 2012.

* cited by examiner

APPARATUS AND METHODS FOR COMPENSATING FOR SIGNAL IMBALANCE IN A RECEIVER

CROSS-REFERENCE TO OTHER APPLICATIONS

This is a divisional application of U.S. patent application Ser. No. 11/938,848, entitled "APPARATUS AND METHODS FOR COMPENSATING FOR SIGNAL IMBALANCE IN A RECEIVER", filed on Nov. 13, 2007, and issued as U.S. Pat. No. 8,090,043, which is a nonprovisional of the following U.S. Provisional Applications, all of which are hereby incorporated by reference herein in their entireties: U.S. Provisional Application No. 60/866,532, entitled, "PACKET AGGREGATION", filed on Nov. 20, 2006, U.S. Provisional Application No. 60/866,527, entitled, "RETRANSMISSION IN A COORDINATED HOME NETWORK", filed on Nov. 20, 2006, U.S. Provisional Application No. 60/866,519, entitled, "IQ IMBALANCING USING TWO-TONE TRANSMISSION IN MULTI-CARRIER RECEIVER", filed on Nov. 20, 2006, U.S. Provisional Application No. 60/907,111, "SYSTEM AND METHOD FOR AGGREGATION OF PACKETS FOR TRANSMISSION THROUGH A COMMUNICATIONS NETWORK", filed on Mar. 21, 2007, U.S. Provisional Application No. 60/907,126, entitled, "MAC TO PHY INTERFACE APPARATUS AND METHODS FOR TRANSMISSION OF PACKETS THROUGH A COMMUNICATIONS NETWORK", filed on Mar. 22, 2007, U.S. Provisional Application No. 60/907,819, entitled, "SYSTEMS AND METHODS FOR RETRANSMITTING PACKETS OVER A NETWORK OF COMMUNICATION CHANNELS", filed on Apr. 18, 2007, and U.S. Provisional Application No. 60/940,998, entitled "MOCA AGGREGATION", filed on May 31, 2007.

FIELD OF THE INVENTION

The present invention relates generally to information networks and specifically to transmitting information such as media information over communication lines such as coax, thereby to form a communications network.

BACKGROUND OF THE INVENTION

Many structures, including homes, have networks based on coaxial cable ("coax").

The Multimedia over Coax Alliance ("MoCA™"), provides at its website (www.mocalliance.org) an example of a specification (viz., that available under the trademark MoCA, which is hereby incorporated herein by reference in its entirety) for networking of digital video and entertainment information through coaxial cable. The specification has been distributed to an open membership.

Technologies available under the trademark MoCA, other specifications and related technologies ("the existing technologies") often utilize unused bandwidth available on the coax. For example, coax has been installed in more than 70% of homes in the United States. Some homes have existing coax in one or more primary entertainment consumption locations such as family rooms, media rooms and master bedrooms. The existing technologies allow homeowners to utilize installed coax as a networking system and to deliver entertainment and information programming with high quality of service ("QoS").

The existing technologies may provide high speed (270 mbps), high QoS, and the innate security of a shielded, wired connection combined with state of the art packet-level encryption. Coax is designed for carrying high bandwidth video. Today, it is regularly used to securely deliver millions of dollars of pay per view and premium video content on a daily basis. Networks based on the existing technologies can be used as a backbone for multiple wireless access points to extend the reach of wireless service in the structure.

Existing technologies provide throughput through the existing coaxial cables to the places where the video devices are located in a structure without affecting other service signals that may be present on the cable. The existing technologies provide a link for digital entertainment, and may act in concert with other wired and wireless networks to extend entertainment throughout the structure.

The existing technologies work with access technologies such as asymmetric digital subscriber lines ("ADSL"), very high speed digital subscriber lines ("VDSL"), and Fiber to the Home ("FTTH"), which provide signals that typically enter the structure on a twisted pair or on an optical fiber, operating in a frequency band from a few hundred kilohertz to 8.5 MHz for ADSL and 12 MHz for VDSL. As services reach such a structure via any type of digital subscriber line ("xDSL") or FTTH, they may be routed via the existing technologies and the coax to the video devices. Cable functionalities, such as video, voice and Internet access, may be provided to the structure, via coax, by cable operators, and use coax running within the structure to reach individual cable service consuming devices in the structure. Typically, functionalities of the existing technologies run along with cable functionalities, but on different frequencies.

The coax infrastructure inside the structure typically includes coax, splitters and outlets. Splitters typically have one input and two or more outputs and are designed to transmit signals in the forward direction (input to output), in the backward direction (output to input), and to isolate outputs from different splitters, thus preventing signals from flowing from one coax outlet to another. Isolation is useful in order to a) reduce interference from other devices and b) maximize power transfer from Point Of Entry ("POE") to outlets for best TV reception.

Elements of the existing technologies are specifically designed to propagate backward through splitters ("insertion") and from output to output ("isolation"). One outlet in a structure can be reached from another by a single "isolation jump" and a number of "insertion jumps." Typically isolation jumps have an attenuation of 5 to 40 dB and each insertion jump attenuates approximately 3 dB. MoCA™-identified technology has a dynamic range in excess of 55 dB while supporting 200 Mbps throughput. Therefore MoCA™-identified technology can work effectively through a significant number of splitters.

Managed network schemes, such as MoCAT™-identified technology, are specifically designed to support streaming video with minimal packet loss between outlets.

When a network-connected device receives a data signal from the network, which may be a network such as that described above, the signal is often decomposed into in-phase ("I") and quadrature ("Q") portions during down-conversion to device base-band frequency. When the I and Q portions are recombined for data decryption, they are often imbalanced with respect to amplitude, phase or both. Rebalancing I and Q portions may involve calculating compensation factors based on frequency-domain signatures of the carrier frequency and the I and Q portions. In the presence of carrier frequency uncertainty, the frequency-domain signatures of received signals may be difficult to resolve using digital computation methods. It would therefore be desirable to provide systems and methods for compensating signals, in the presence of carrier frequency uncertainty, using digital computation methods.

SUMMARY OF THE INVENTION

A system and/or method for compensating for an I/Q imbalance at a node on a communication network, substantially as shown in and/or described in connection with at least one of the figures, as set forth more completely in the claims.

BRIEF DESCRIPTION OF THE DRAWINGS

The above and other features of the present invention, its nature and various advantages will be more apparent upon consideration of the following detailed description, taken in conjunction with the accompanying drawings, and in which.

12A shows an illustrative simulation minimization

DETAILED DESCRIPTION OF EMBODIMENTS

Apparatus and methods for compensating for an I/Q imbalance are provided in accordance with the principles of the invention. The methods may include compensating for an imbalance between a first component of a data signal and a second component of the data signal. The data signal may be modulated by a carrier signal having a frequency error. The first component may be characterized by at least one parameter. The method may include receiving the data and carrier signals; selecting a value for the parameter such that a frequency domain energy is reduced, the frequency domain energy corresponding to a negative frequency; and modifying at least one of the components based on the selected value.

The apparatus may include a circuit operative to record signal values corresponding to frequency components of a received signal. The signal may be one that carries at least one orthogonal frequency division multiplexing ("OFDM") symbol. The signal values may correspond to a carrier frequency having a frequency error; a first tone; and a second tone.

The apparatus may include a system for compensating for an imbalance between a first component of a data signal and a second component of the data signal. The data signal may be modulated by a carrier signal having a frequency error. The first component may be characterized by at least one parameter. The system may include a hardware module configured to quantify a signal value corresponding to one of the data and carrier signals; and a software module configured to receive the signal value from the hardware.

The first and second tones may be transmitted in the context of a MoCA protocol probe2 transmission as set forth in the aforementioned MoCA specification.

Illustrative features of the invention are described below with reference to FIGS. 1-8 and Appendices A-E.

Figure 1:
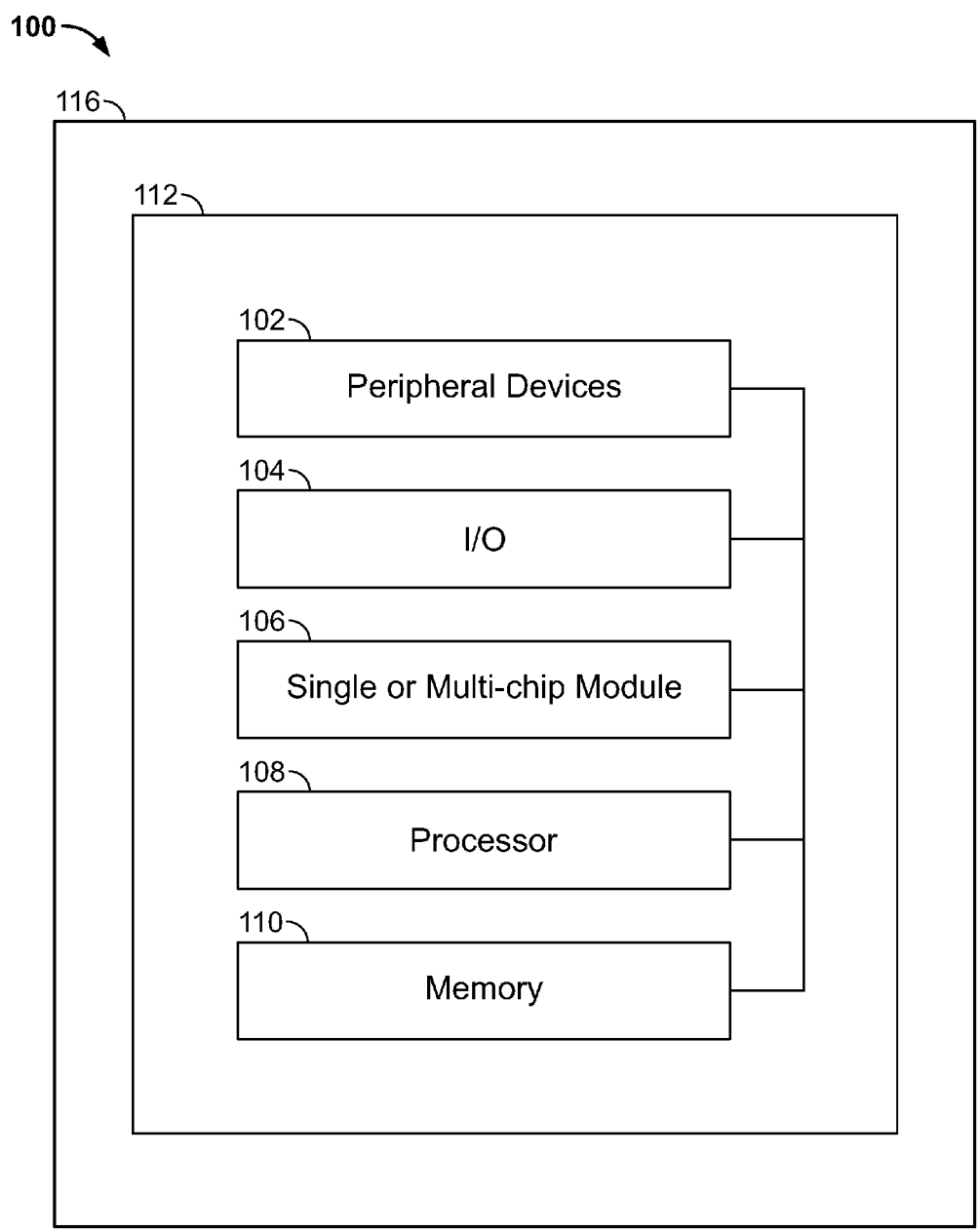
FIG. 1 shows an illustrative schematic diagram of an illustrative single or multi-chip device that may be used in accordance with principles of the invention.

FIG. 1 shows a single or multi-chip module 102 according to the invention, which can be one or more integrated circuits, in an illustrative data processing system 100 according to the invention. Data processing system 100 may include one or more of the following components: I/O circuitry 104, peripheral devices 106, processor 108 and memory 110. These components may be coupled together by a system bus or other interconnections 112 and are disposed on a circuit board 120 in an end-user system 130. Elements of module 102 may perform tasks involved in I/Q imbalance compensation.

In some embodiments, I/Q imbalance compensation may be performed during MoCA Probe2 burst reception. Probe2 is a two-tone signal which can be used for I/Q imbalance calculations or other RF calibrations in the receiver. A PHY layer performs bin selection and recording and the result is uploaded to the CPU for the I/Q compensation parameters calculations.

Figure 2:
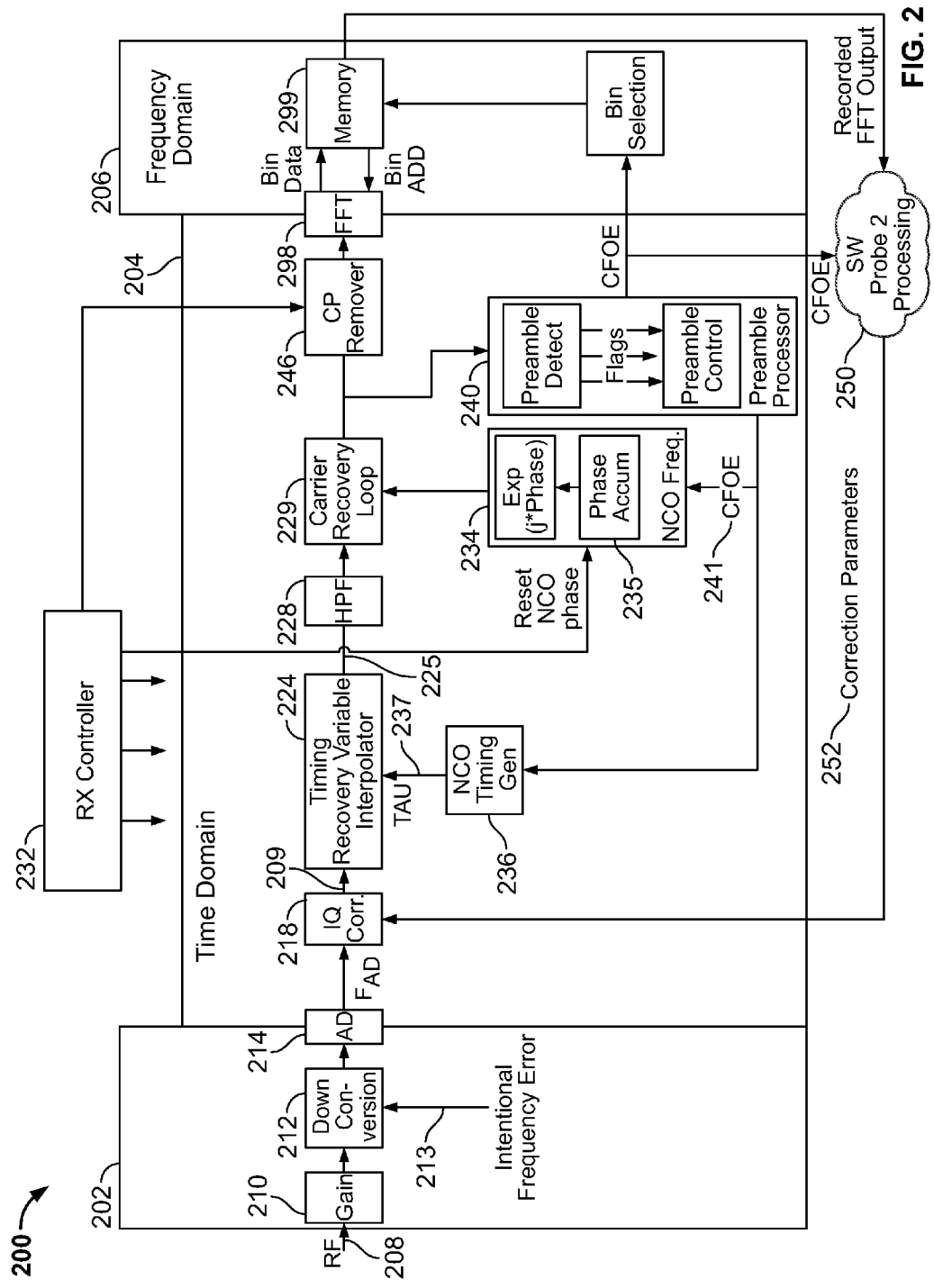
FIG. 2 shows an illustrative schematic diagram of a portion of a receiver in accordance with the principles of the invention.

FIG. 2 shows a partial schematic diagram of illustrative receiver 200. Receiver 200 may include radio frequency ("RF") processing module 202, time domain processing module 204 and frequency domain processing module 206. RF signal 208 is received and gain-adjusted at gain 210. Signal 208 is down-converted to base band ("BB") frequency at 212. Intentional frequency error 213 is added to signal 208 at 212. Analog-to-digital converter 214 converts signal 208 to a digital signal sampled at the analog-to-digital sampling rate and passes signal 208 to imbalance compensation module 218. I/Q imbalance compensation module 218 may be configured to carry out steps associated herein with I/Q compensation. I/Q imbalance compensation module 218 outputs signal 209, which corresponds to Equation 1 (below).

Signal 209 passes to variable rate interpolator 224, which resamples signal 209 to an appropriate sampling rate.

The variable rate interpolator 224 may receive timing signal 237 from numerically controlled oscillator ("NCO") timing generator 236. Timing signal 237 may be based on carrier frequency offset estimate ("CFOE") 241, from preamble processor 240. CFOE 241 may be based on a preamble processor 240 estimate. Interpolator 224 outputs signal 225, which may then pass through high pass filter ("HPF") 228 to reject direct current ("DC") signal components.

Carrier recovery loop 229 may be present to perform frequency compensation for intentional frequency error 213. Carrier recovery loop 229 may receive input from NCO frequency generator 234, which may be controlled by receiver controller 232. NCO frequency generator 234 may receive carrier frequency offset estimate 241 from preamble processor 240. A cyclic prefix may be removed from signal 225 at CP remover 246.

Fast Fourier transform module 298 may be present in frequency domain processing module 206 to transform signal 225 into frequency domain information ("FFT output") that may be stored in memory 299 and may be communicated to probe2 software processing routine 250, which may output correction parameters 252 for return to I/Q imbalance compensation module 218.

Figure 3:
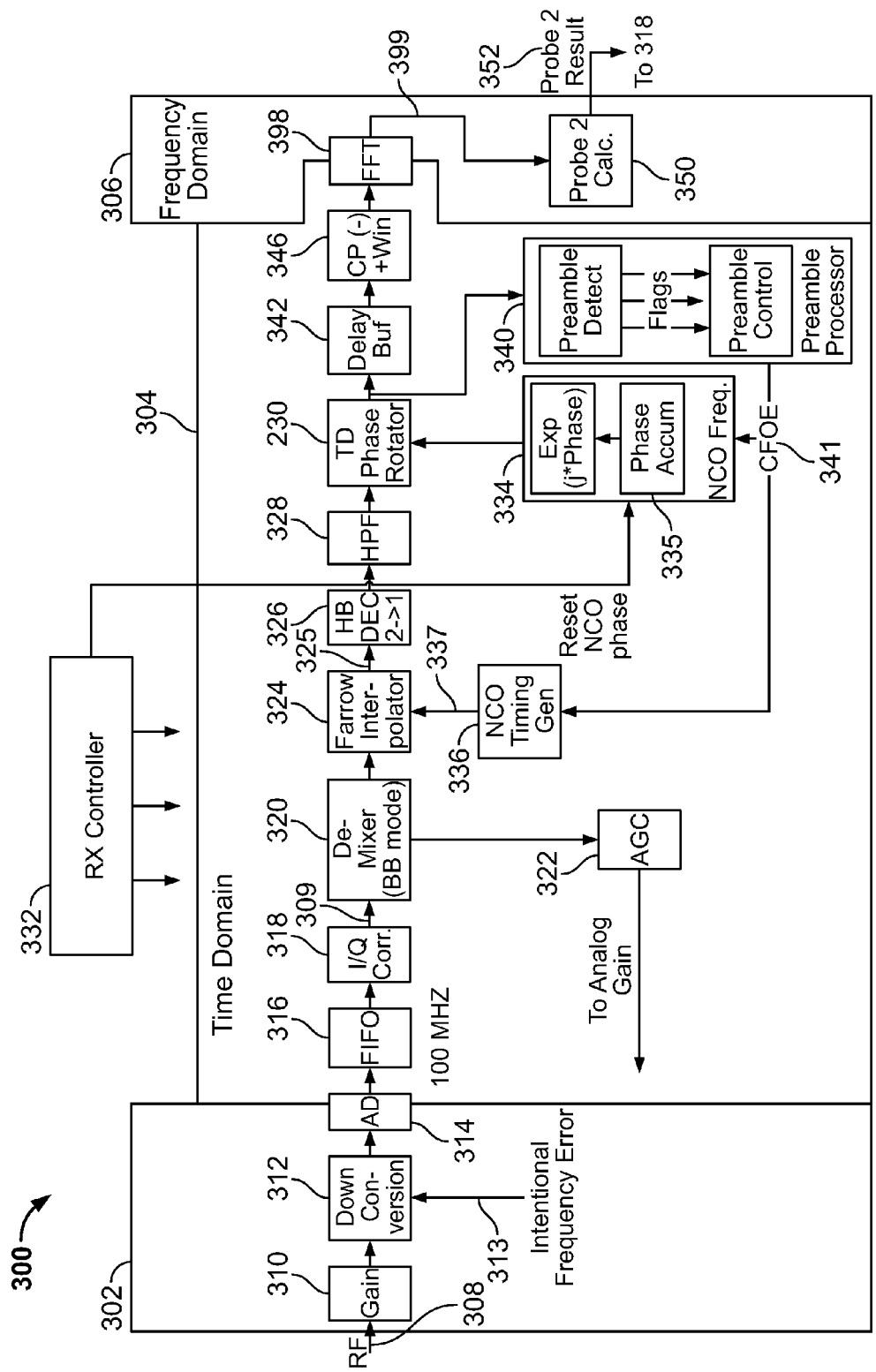
FIG. 3 shows another illustrative schematic diagram of a portion of a receiver in accordance with the principles of the invention.

FIG. 3 shows a partial schematic diagram of illustrative receiver 300. Receiver 300 may include radio frequency ("RF") processing module 302, time domain processing module 304 and frequency domain processing module 306. RF signal 308 is received and gain-adjusted at gain 310. Signal 308 is down-converted to base band frequency at 312. Intentional frequency error 313 is added to signal 308 at 312. Analog-to-digital converter 314 converts signal 308 to a digital signal and passes signal 308 to 100 MHz FIFO ("first in, first out") buffer 316. Buffer 316 passes signal 308 to I/Q imbalance compensation module 318. I/Q imbalance compensation module 318 may be configured to carry out steps associated herein with I/Q compensation. I/Q imbalance compensation module 318 outputs signal 309, which corresponds to Equation 1 (below).

Signal 309 passes to baseband-mode demixer 320. Receiver 300 may include automatic gain controller 322, which may provide feedback to gain 310 based on signal 309. From demixer 320, signal 309 may pass to Farrow interpolator 324, which resamples 100 MHz signal 309 at a lower rate.

Farrow interpolator 324 may receive timing signal 337 from numerically controlled oscillator ("NCO") timing generator 336. Timing signal 337 may be based on carrier frequency offset estimate 341, from preamble control processor 340. Carrier frequency offset estimate 341 may be based on the output of TD phase rotator 330 (discussed below), via preamble processor 340. In some embodiments, interpolator 324 outputs signal 325 at 100 MHz. Signal 325 may be synchronized to a transmitter clock (not shown) via a timing recover loop (not shown). Signal 325 may be down-sampled by a factor of 2, via half band filter decimator ("HB DEC 2→1") 326, to 50 MHz. Signal 325 may then pass through high pass filter ("HPF") 328 to reject direct current ("DC") signal components.

Time domain ("TD") phase rotator 330 may be present to perform frequency compensation for intentional frequency error 313. TD phase rotator may receive input from NCO frequency generator 334, which may be controlled by receiver controller 332. NCO frequency generator 334 may receive carrier frequency offset estimate 341 from preamble processor 340. Signal 325 may then pass to delay buffer 342. A cyclic prefix may be removed at sub-circuit 346. In some embodiments, sub-circuit 346 may perform receiver windowing to reduce damage from narrow band interference noise that might otherwise leak into adjacent tones.

Fast Fourier transform module 398 may be present in frequency domain processing module 306 to transform signal 325 into frequency domain information that may be communicated to probe2 calculator 350, which may output probe2 result 352, for transmission to I/Q compensation module 318.

Some embodiments include a bypass mode, in which signal input is routed to output around I/Q imbalance compensation module 318.

In some embodiments, I/Q compensation is accomplished by digital signal analysis and processing. In those embodiments, $\zeta$, $\rho$ & Scale_Q are I/Q compensation parameters that have to be estimated during Probe2.

Equation 1 shows compensated real and imaginary portions of a compensated signal that would be output from the I/Q imbalance compensation module (see FIG. 2).

$$\tilde{Y}_{real} = \begin{cases} \text{Bypass} == 1 & Y_{real} \\ \text{Bypass} == 0 & \begin{cases} \text{Scale\_Q} == 0 & \varsigma Y_{real} \\ \text{Scale\_Q} == 1 & Y_{real} \end{cases} \end{cases} \quad \text{Equation 1}$$

$$\tilde{Y}_{imag} = \begin{cases} \text{Bypass} == 1 & Y_{imag} \\ \text{Bypass} == 0 & \begin{cases} \text{Scale\_Q} = 0 & \tilde{Y}_{imag} = Y_{imag} + \rho Y_{real} \\ \text{Scale\_Q} = 1 & \varsigma Y_{imag} + \rho Y_{real} \end{cases} \end{cases}$$

Figure 4:
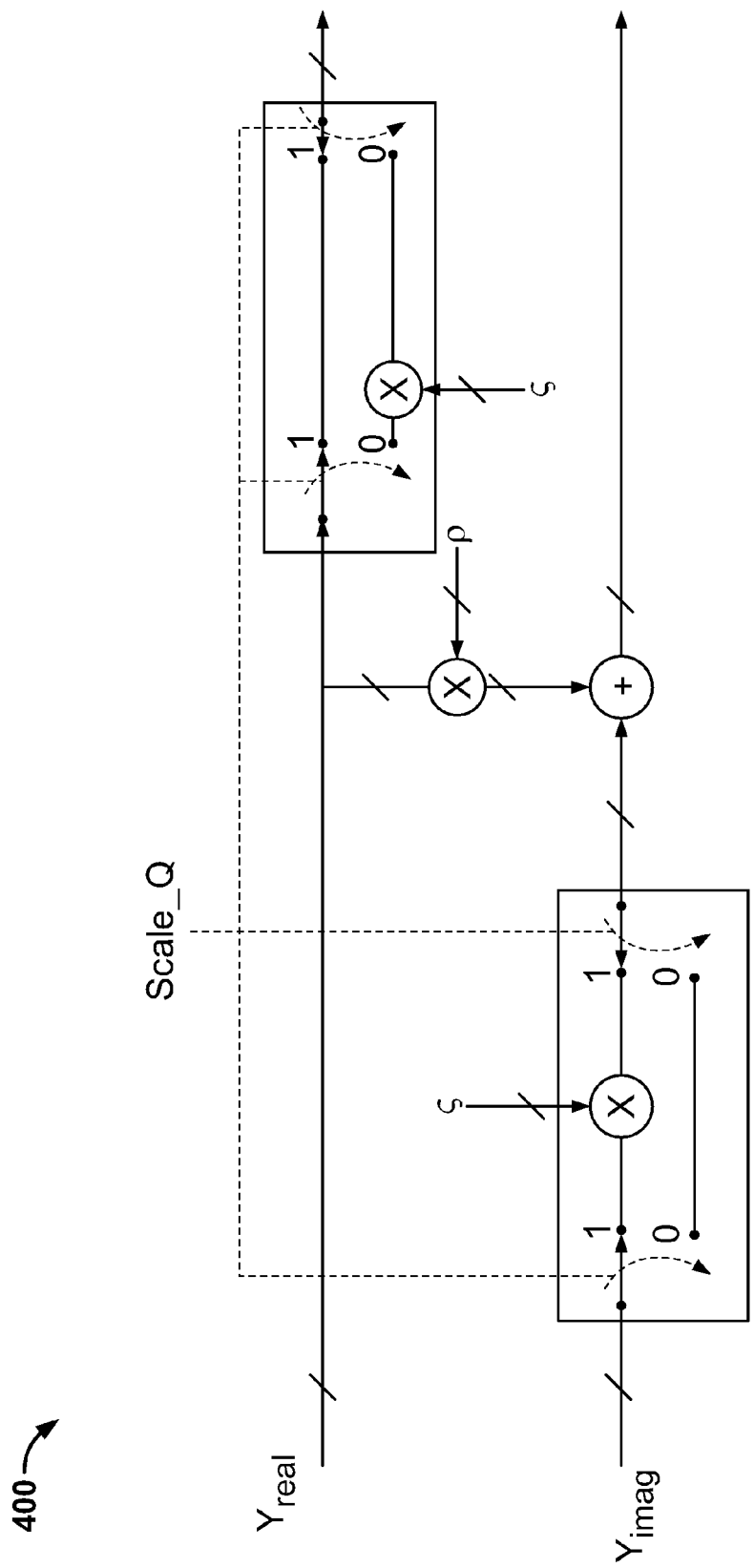
FIG. 4 shows an illustrative schematic diagram of a circuit in accordance with the principles of the invention.

FIG. 4 shows illustrative circuit 400, which may be included in a device for implementing the compensation set forth in Equation 1.

Figure 5:
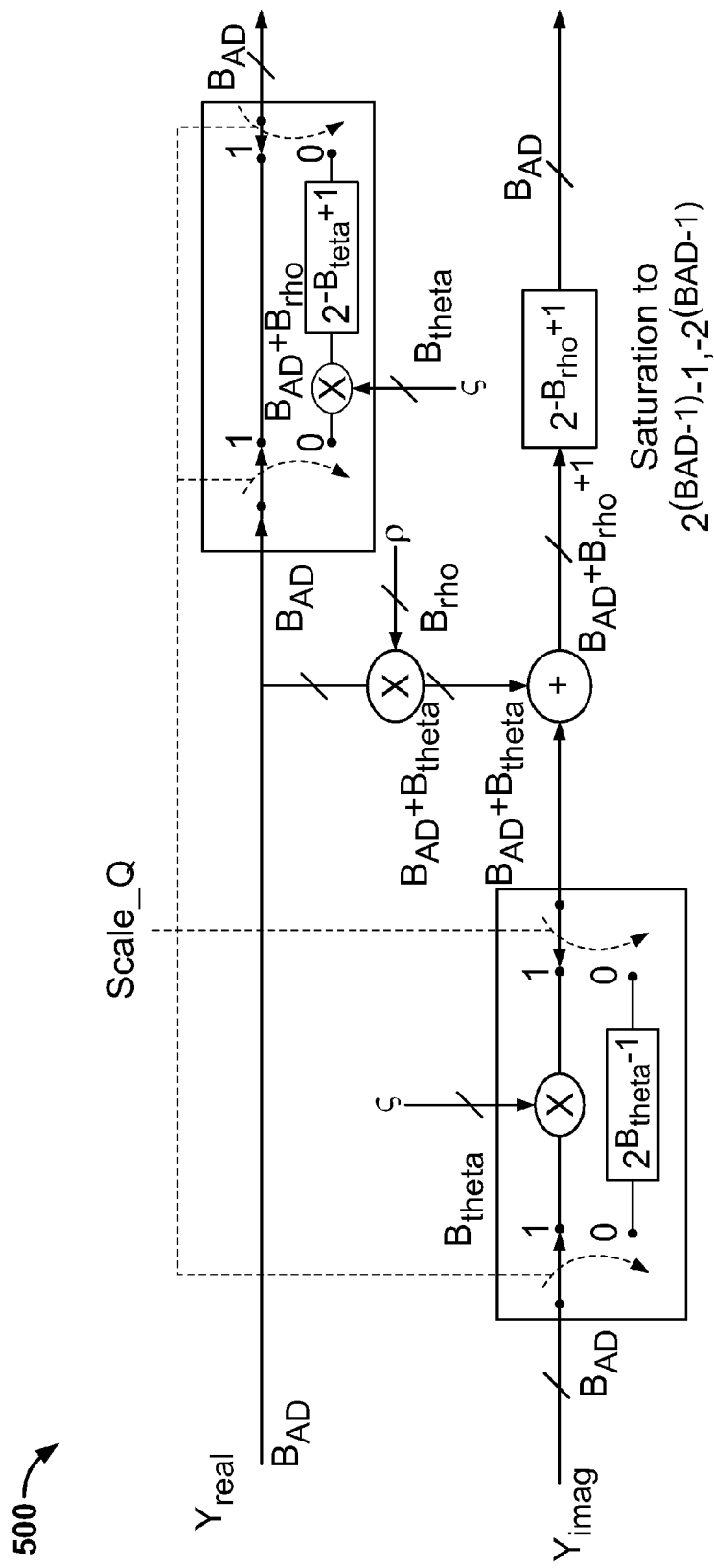
FIG. 5 shows another illustrative schematic diagram of a circuit in accordance with the principles of the invention.

FIG. 5 shows illustrative circuit 500, which may be included in a device for implementing the compensation set forth in Equation 1. Appendix A sets forth the theoretical basis for the compensation set forth in Equation 1. Appendix B shows exemplary imbalance and compensation measurements that have been made in connection with the apparatus and methods described herein.

Figure 6:
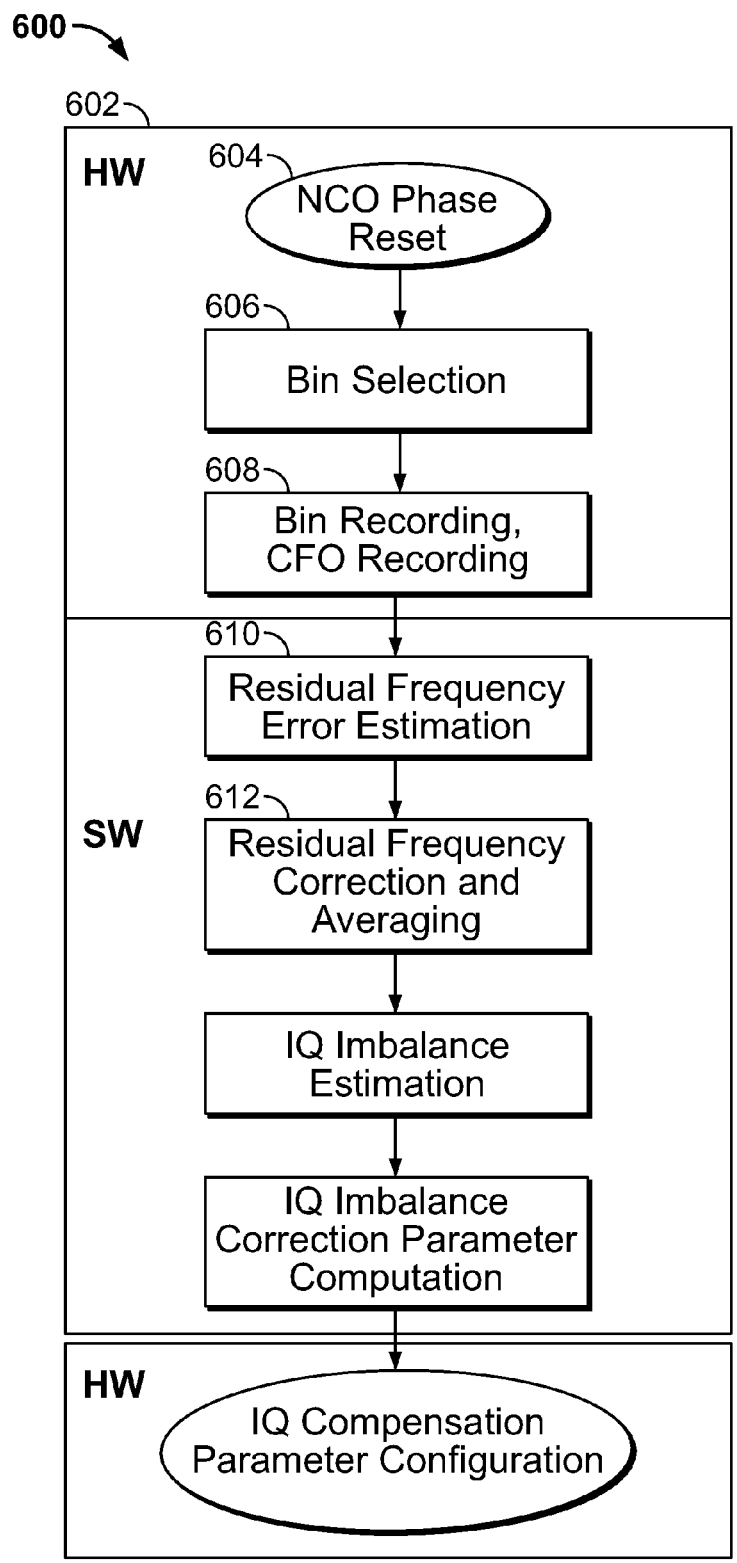
FIG. 6 shows an illustrative flow chart in accordance with the principles of the invention.

FIG. 6 shows illustrative process 600 for compensating I/Q imbalance. Process 600 involves both hardware ("HW") and software ("SW") operations. The output of initial hardware operation 602 is a data array Z(k,m), which is the output of a Fast Fourier Transform ("FFT") at bin k corresponding to Probe2 OFDM symbol m.

Initial hardware operation 602 may include numerically controlled oscillator ("NCO") phase reset 604. The phase of the first sample of an FFT window that results from Time Domain Unit ("TDU") frequency compensation is determined. For this purpose the NCO Phase of the Phase Rotator in the Receiver TDU shall be reset to zero anytime after fine frequency compensation has been computed. The number of samples (number of phase accumulations) between the reset of the NCO and the first sample of the FFT window denoted as $\Delta n$ shall be computed and sent to the SW routine. Zero phase accumulations (i.e., $\Delta n=0$) is most desirable since it reduces complexity of the SW routine. For the setting $\Delta n=0$, NCO phase accumulator 335 (in NCO frequency generator 334—see FIG. 3) should be reset once the first sample of the 356 point FFT window propagates through TD phase rotator 330 (see FIG. 3) (and thus the first sample would be multiplied by unity).

Figure 7:
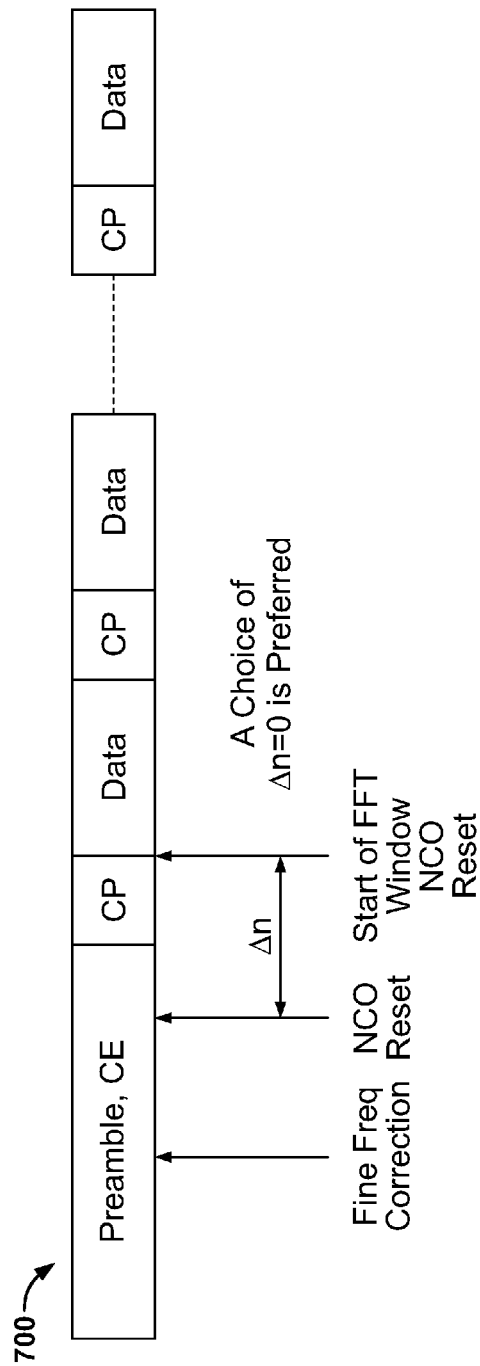
FIG. 7 shows, in abridged form, an illustrative data packet that may be processed in accordance with the principles of the invention.

FIG. 7 shows packet 700, NCO reset, $\Delta n$ and the start of the FFT window.

In some embodiments, bin selection 606 (see FIG. 6) may be performed as a floating point computation, in which $i_1$ and $i_2$ are frequency bin indices computed as shown in Equation 2.

$$i_1 = -\text{round}\left(\frac{N \cdot CFO}{\pi}\right) \quad \text{Equation 2}$$

$$i_2 = i_1 + \text{sign}(CFO) \cdot \text{sign}\left(|i_1| - \left|\frac{N \cdot CFO}{\pi}\right|\right)$$

Wherein CFO/(2π) is the estimated carrier frequency offset between a transmitter and the receiver and N is the number of FFT bins (e.g., 256).

In some embodiments, bin selection 606 (see FIG. 6) may be performed as a fixed point computation. In those embodiments, CFO is a 17 bit signed integer, where '1'=$2^{14}$. The computation of $i_1$ and $i_2$ may be done via comparison to fixed thresholds. The value of the FFT grid in fixed point representation is given by Equation 3:

$$F_k = \text{round}\left(\frac{2\pi k}{N} \cdot 2^{Freq\_bits-1}\right), \quad \text{Equation 3}$$
$$\text{for } k = [-3, 3],$$

in which Freq_bits may be set to 14 or any other suitable number. Indices $i_1$ and $i_2$ are selected by finding the two FFT bins closest to 2CFO.

Figure 8:
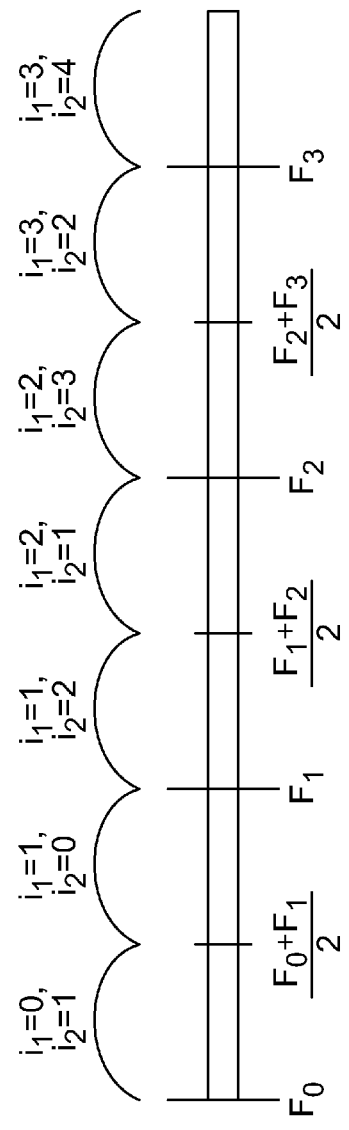
FIG. 8 shows an illustrative portion of a discrete-valued frequency spectrum associated with signal processing in accordance with the principles of the invention.

FIG. 8 shows decision areas (absolute values only due to symmetry) corresponding to Equation 3.

Figure 9:
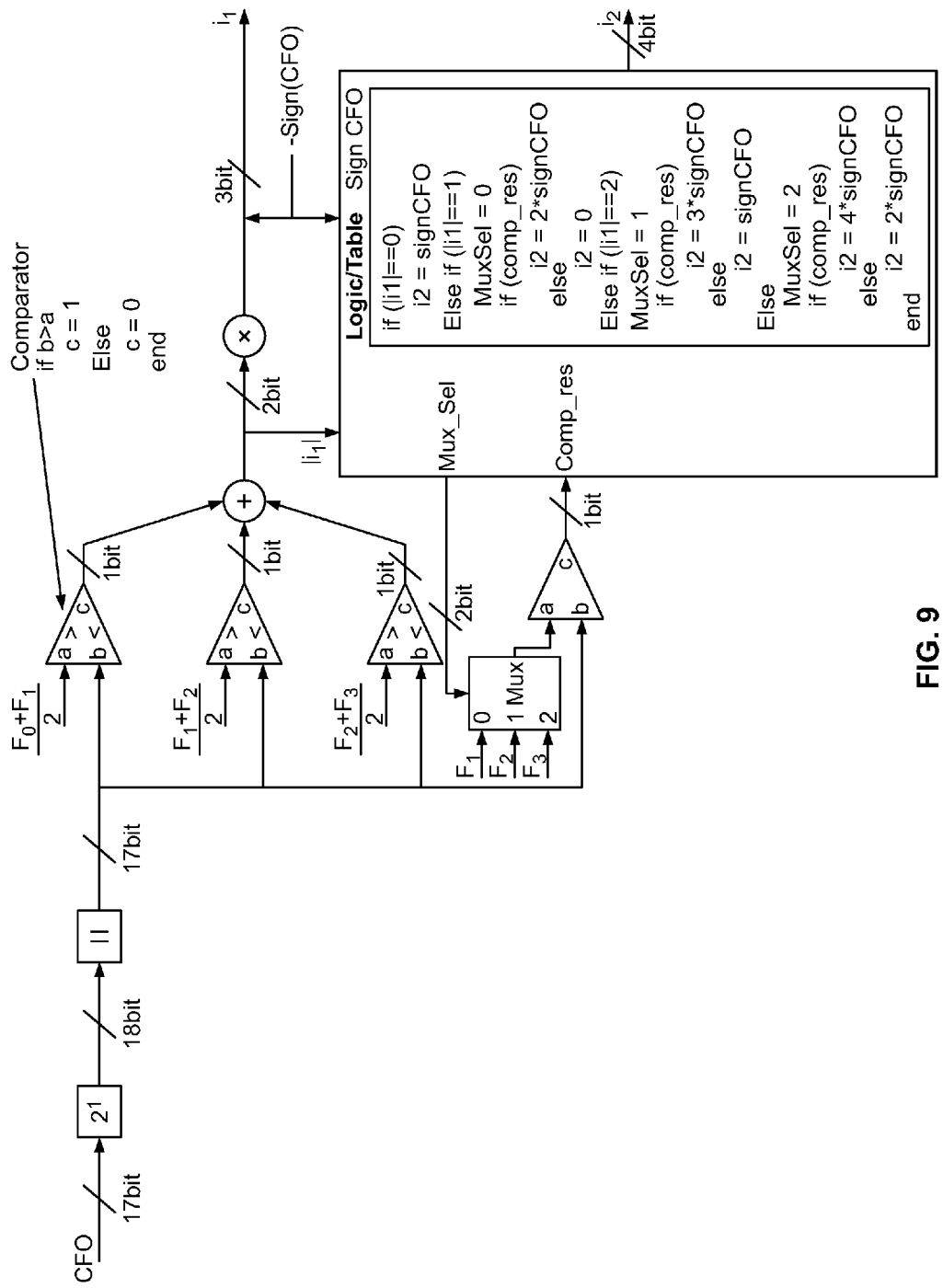
FIG. 9 shows an illustrative schematic diagram of a another circuit in accordance with the principles of the invention.

FIG. 9 shows an illustrative hardware ("HW") implementation for decision area boundary selection. Table 1 shows illustrative boundary values.

TABLE 1

| \|Frequency Boundaries\| | $\frac{F_0 + F_1}{2}$ | $\frac{F_1 + F_2}{2}$ | $\frac{F_2 + F_3}{2}$ | $F_1$ | $F_2$ | $F_3$ |
|---|---|---|---|---|---|---|
| Fixed point value | 804 | 2413 | 4012 | 1608 | 3217 | 4825 |

Equation 4 sets forth a definition for the sign operation.

$$\text{sign}(x) = \begin{cases} 1 & x \geq 0 \\ -1 & x < 0 \end{cases} \quad \text{Equation 4}$$

In some embodiments, bin recording (at step 408, see FIG. 4) may involve 16 bit FFT outputs at bins $k_1$, $-k_1+i_1$, $-k_1+i_2$, $k_2$, $-k_2+i_1$, $-k_2+i_2$, which are then recorded for each of L OFDM symbols. It will be understood that there may be any suitable number of bits at the FFT output. The addresses in MoCA FFT that correspond to the bins are set forth in Table 2.

TABLE 2

| ADDR: $k_1$ | $Z[k_1, m]$ | $k_1 \in [146, 186]$ |
| ADDR: $k_2$ | $Z[k_2, m]$ | $k_2 \in [217, 249]$ |
| ADDR: 256 − $k_1 + i_1$ | $Z[-k_1+i_1, m]$, | $-k_1+i_1 = 256 - k_1 + i_1 \in [67, 113]$ |
| ADDR: 256 − $k_1 + i_2$ | $Z[-k_1+i_2, m]$, | $-k_1+i_2 = 256 - k_1 + i_2 \in [66, 112]$ |
| ADDR: 256 − $k_2 + i_1$ | $Z[-k_2+i_1, m]$, | $-k_2+i_1 = 256 - k_2 + i_1 \in [4, 36]$ |
| ADDR: 256 − $k_2 + i_2$ | $Z[-k_2+i_2, m]$, | $-k_2+i_2 = 256 - k_2 + i_2 \in [3, 37]$ |

Figure 10:
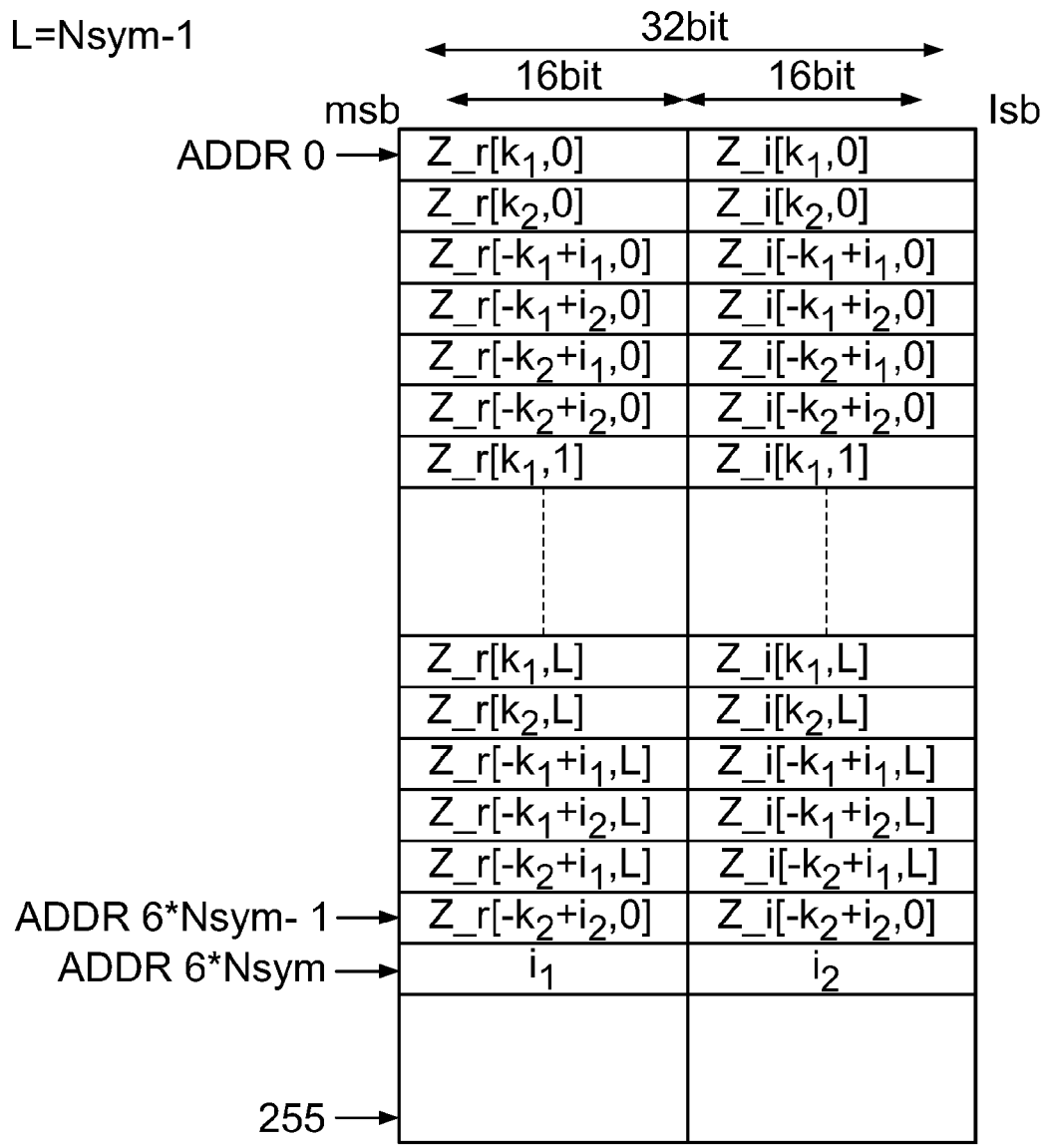
FIG. 10 shows a schematic memory configuration in accordance with the principles of the invention.

FIG. 10 shows an illustrative memory map at the end of a probe2 burst.

A CFO estimate is recorded at step 608 (shown in FIG. 6). The estimate may be a 17-bit estimate.

In some embodiments, residual frequency error $\hat{\epsilon}$ estimation 610 (see FIG. 6) may be performed by a software module. In some embodiments, residual frequency error estimation may be performed by a hardware module. In some embodiments, residual frequency error estimation may be computed as shown in Equation 5.

$$\hat{\epsilon} = \frac{\text{angle}\left(\sum_{m=o}^{L-2} Z[k_i, m]Z^*[k_i, m+1]\right)}{2\pi(N + N_{CP})} \quad \text{Equation 5}$$

$$\text{Where } k_i = \begin{cases} k_1 & SNR_{k_1} > SNR_{k_2} \\ k_2 & SNR_{k_2} > SNR_{k_1} \end{cases}$$

In some embodiments, residual frequency error compensation and time averaging may be computed in accordance with Equations 6, which depend on $\hat{\epsilon}$ and whose derivations are set forth in Appendix A.

$$\bar{Z}_{k_1} = \sum_{m=o}^{L-1} Z[k_1, m]e^{-j2\pi\hat{\epsilon}(N+N_{CP})m} \quad \text{Equation 6}$$

$$\bar{Z}_{k_2} = \sum_{m=o}^{L-1} Z[k_2, m]e^{-j2\pi\hat{\epsilon}(N+N_{CP})m}$$

$$\bar{Z}_{-k_1+i_1} = \sum_{m=o}^{L-1} Z[-k_1+i_1, m]e^{-j(2CFO+2\pi\hat{\epsilon})(N+N_{CP})m}$$

$$\bar{Z}_{-k_2+i_1} = \sum_{m=o}^{L-1} Z[-k_2+i_1, m]e^{-j(2CFO+2\pi\hat{\epsilon})(N+N_{CP})m}$$

$$\bar{Z}_{-k_1+i_2} = \sum_{m=o}^{L-1} Z[-k_1+i_2, m]e^{-j(2CFO+2\pi\hat{\epsilon})(N+N_{CP})m}$$

$$\bar{Z}_{-k_2+i_2} = \sum_{m=o}^{L-1} Z[-k_2+i_2, m]e^{-j(2CFO+2\pi\hat{\epsilon})(N+N_{CP})m}$$

Equations 7 may be used to evaluate an I/Q imbalance phasor estimate, which may be computed using Equation 8.

$$B_n = \begin{cases} \frac{1}{2}\left(\frac{\sin(2 \cdot CFO \cdot N)}{CFO + \frac{\pi \cdot i_n}{N}}\right) + & CFO \neq 0 \\ \frac{j}{2}\left(\frac{\cos(2 \cdot CFO \cdot N) - 1}{CFO + \frac{\pi \cdot i_n}{N}}\right) & \\ N & CFO = 0, i_n = 0 \\ 0 & CFO = 0, i_n \neq 0 \end{cases} \quad \text{Equation 7}$$

$$C_1 = \frac{e^{j2CFO(\Delta n)}}{N} \frac{(|B_1|^2 + |B_2|^2) \cdot \bar{Z}_{k_1}}{B_1(\bar{Z}_{-k_1+i_1})^* + B_2(\bar{Z}_{-k_1+i_2})^*}$$

$$C_2 = \frac{e^{j2CFO(\Delta n)}}{N} \frac{(|B_1|^2 + |B_2|^2) \cdot \bar{Z}_{k_2}}{B_1(\bar{Z}_{-k_2+i_1})^* + B_2(\bar{Z}_{-k_2+i_2})^*}$$

$$C = \frac{1}{2}(C_1 + C_2)$$

$$\widehat{ge^{-j\theta}} = \frac{C-1}{C-1} \quad \text{Equation 8}$$

I/Q imbalance compensation parameters ξ,ρ and Scale_Q (see, e.g., Equation 1) may then be computed in accordance with Equation 9.

$$\begin{cases} \text{real}\{\overline{ge^{-j\theta}}\} \geq 1 & ScaleQ = 1 & \hat{\xi} = \dfrac{1}{\text{real}\{\overline{ge^{-j\theta}}\}}, & \hat{\rho} = -\dfrac{imag\{\overline{ge^{-j\theta}}\}}{\text{real}\{\overline{ge^{-j\theta}}\}} \\ \text{otherwise} & ScaleQ = 0 & \hat{\xi} = \text{real}\{\overline{ge^{-j\theta}}\}, & \hat{\rho} = -imag\{\overline{ge^{-j\theta}}\} \end{cases}$$

Equation 9

Equation 9 avoids saturation at the receiver since is always smaller or equal than unity, thus attenuating the stronger I/Q signal rather than amplifying the weaker I/Q signal. In some embodiments, the above computations can be carried out in an iterative fashion over several probe2 transmissions. Equations 10 show how new phasor estimates may be used to update previous estimates.

$$(\overline{ge^{-j\theta}})_i^{ACC} = (1-\mu_i)(\overline{ge^{-j\theta}})_{i-1}^{ACC} + \mu_i(\overline{ge^{-j\theta}})_{i-1}^{ACC} \cdot (\overline{ge^{-j\theta}})$$

$$(\overline{gee^{-j\theta}})_0^{ACC} = 1$$

Equations 10

In Equations 10, $(\overline{ge^{-j\theta}})$, is the phasor estimate computed during the i'th probe2 transmission. Some embodiments may include an update routine that may use a first order loop with a loop gain of $\mu_i \in [0,1]$. The loop gain may provide a tradeoff between convergence speed and noise filtering by controlling the loop bandwidth ("BW"). A gear-shifting approach may be used in which the loop BW is dynamically changed during convergence. For fast convergence during the first two/three iterations, a high loop BW may be used. For consecutive probe2 transmissions, a small loop BW may be used. Equation 11 sets forth values that may be used for $\mu_i$. i denotes the probe2 burst index number.

$$\mu_i = \begin{cases} 1 & i = 1 \\ 0.75 & i = 2 \\ 0.5 & i = 3 \\ 0.25 & i = 4 \end{cases}$$

Equation 11

Equations 12 set forth I/Q compensation parameters that may be used during the reception of the i'th probe2.

$$\begin{cases} \text{real}\{(\overline{ge^{-j\theta}})_{i-1}^{ACC}\} \geq 1 & \hat{\xi}_i = \dfrac{1}{\text{real}\{(\overline{ge^{-j\theta}})_{i-1}^{ACC}\}}, & \hat{\rho}_i = -\dfrac{imag\{(\overline{ge^{-j\theta}})_{i-1}^{ACC}\}}{\text{real}\{(\overline{ge^{-j\theta}})_{i-1}^{ACC}\}} \\ \text{otherwise} & \hat{\xi}_i = \text{real}\{(\overline{ge^{-j\theta}})_{i-1}^{ACC}\}, & \hat{\rho}_i = -imag\{(\overline{ge^{-j\theta}})_{i-1}^{ACC}\} \end{cases}$$

Equation 12

Three to four iterations (which may correspond to 3 to 4 probe2 transmissions) are often sufficient to compensate for I/Q imbalance.

Appendix C sets forth pseudo-code for a fixed point implementation of the compensation.

Appendix D sets forth parameters for a hardware-software interface in a system for I/Q imbalance compensation.

A network node may acquire an estimate of signal to noise ratio ("SNR") at each tone and carrier frequency offset (relative to an associated network coordinator ("NC")) when the node processes one or more probe 1 bursts from the NC. The node may use the SNR estimates to inform the NC which two frequency bins to use for probe2 transmission to the node. The node may use the CFO estimate to calculate and communicate to the NC the number of OFDM symbols and the cyclic prefix ("CP") length during probe2 transmission.

Appendix E sets forth illustrative pseudocode for computation of frequency offset introduction, CP and selection of a number of OFDM symbols. In some embodiments, the Probe2, CP and L algorithms set forth in Appendix E may be performed before sending a MoCA™ probe2 report and after a receiver RF generator introduces any required, necessary or intentional carrier offset.

For the sake of clarity, the foregoing description, including specific examples of parameters or parameter values, is sometimes specific to certain protocols such as those identified with the name MoCA™ and/or Ethernet protocols. However, this is not intended to be limiting and the invention may be suitably generalized to other protocols and/or other packet protocols. The use of terms that may be specific to a particular protocol such as that identified by the name MoCA™ or Ethernet to describe a particular feature or embodiment is not intended to limit the scope of that feature or embodiment to that protocol specifically; instead the terms are used generally and are each intended to include parallel and similar terms defined under other protocols.

It will be appreciated that software components of the present invention including programs and data may, if desired, be implemented in ROM (read only memory) form, including CD-ROMs, EPROMs and EEPROMs, or may be stored in any other suitable computer-readable medium such as but not limited to discs of various kinds, cards of various kinds and RAMs. Components described herein as software may, alternatively, be implemented wholly or partly in hardware, if desired, using conventional techniques.

Thus, systems and methods for compensating for I/Q imbalance have been described. Persons skilled in the art will appreciate that the present invention can be practiced using embodiments of the invention other than those described, which are presented for purposes of illustration rather than of limitation. The present invention is limited only by the claims which follow.

APPENDIX A

Probe2 Theory

The I/Q imbalance can be modeled as a multiplicative gain factor applied on one of the I/Q components as well a relative phase difference. During probe2 reception MoCA specifies that a receiver must introduce a frequency error during RF down conversion we shall denote this shift as $\phi$. The converted signal is given by:

$$z_i[n] = s_i[n]\cos(2\pi\phi n) - s_q[n]\sin(2\pi\phi n) + w_i[n]$$

$$z_q[n] = gs_i[n]\sin(2\pi\phi n - \theta) + gs_q[n]\cos(2\pi\phi n - \theta) + w_q[n]$$

Some algebra shows that the above can be expressed as $$z[n] = K_1 s[n] e^{j2\pi\phi n} + K_2 s^*[n] e^{9-j2\pi\phi n} + w[n]$$

$$K_1 = \frac{1}{2}(1 + g e^{-j\theta})$$

$$K_2 = \frac{1}{2}(1 - g e^{j\theta})$$

At the receiver I/Q compensation is performed the signal after I/Q compensation is given by:

$$z'[n] = \{real(K_1 s[n] e^{j2\pi\phi n} + K_2 s^*[n] e^{-j2\pi\phi n} + w[n])\}$$

$$+ j\xi\{imag(K_1 s[n] e^{j2\pi\phi n} + K_2 s^*[n] e^{-j2\pi\phi n} + w[n])\}$$

$$+ j\rho\{real(K_1 s[n] e^{j2\pi\phi n} + K_2 s^*[n] e^{-j2\pi\phi n} + w[n])\}$$

Assuming transmission of a single frequency at frequency bin k, after some algebra the compensated signal is given by $$z'[n] = \{|h| \cos(2\pi n(k/N + \phi) + \angle h)\}$$

$$+ j\xi\{g|h|\sin(2\pi n(k/N + \phi) + \angle h - \theta)\}$$

$$+ j\rho\{|h|\cos(2\pi n(k/N + \phi) + \angle h)\} + [w_r[n] + j(\rho \cdot w_r[n] + \xi \cdot w_i[n])]$$

The signal over goes frequency compensation and then is transformed into the frequency domain via the FFT operation. After some algebra the frequency domain signals at bins k and −k are given by:

$$\hat{Z}[k] = |h| e^{j\angle h} N \left[ \frac{1}{2}(1 + \xi g e^{-j\theta}) + \frac{\rho}{2} e^{j\frac{\pi}{2}} \right] +$$

$$|h| e^{-j\angle h} e^{-j\left(2\pi(N-1)\left(\frac{k}{N}+\varphi\right)\right)} \frac{\sin(2\pi(k + N\varphi))}{\sin\left(2\pi\left(\frac{k}{N}+\varphi\right)\right)} \left[ \frac{1}{2}(1 - \xi g e^{j\theta}) + \frac{\rho}{2} e^{j\frac{\pi}{2}} \right]$$

$$\hat{Z}[-k] = |h| e^{-j\angle h} e^{-j(2\pi\varphi(N-1))} \frac{\sin(2\pi\varphi N)}{\sin(2\pi\varphi)} \left\{ \frac{1}{2}(1 - \xi g e^{j\theta}) + \frac{\rho}{2} e^{j\frac{\pi}{2}} \right\}$$

In a system without I/Q imbalance, the energy at the negative bin is zero. The energy at the negative bin due to I/Q imbalance is given by $$\left|\hat{Z}[-k]\right|^2 =$$

$$|h|^2 \left( \frac{\sin(2\pi\varphi N)}{\sin(2\pi\varphi)} \right)^2 \left\{ \frac{1}{2}(1 - \xi g e^{j\theta}) + \frac{\rho}{2} e^{j\frac{\pi}{2}} \right\} \left\{ \frac{1}{2}(1 - \xi g e^{-j\theta}) + \frac{\rho}{2} e^{-j\frac{\pi}{2}} \right\} =$$

$$\frac{1}{4} |h|^2 \left( \frac{\sin(2\pi\varphi N)}{\sin(2\pi\varphi)} \right)^2 \{1 + \xi^2 g^2 + \rho^2 - 2\xi g \cos\theta - 2\xi g \rho \sin(\theta)\}$$

Thus our target is to minimize the energy of bin −k by using $\rho$, $\xi$. Minimizing using the Lagrange multipliers method gives the following equations $$\frac{\partial \left|\hat{Z}[-k]\right|^2}{\partial \xi} = \frac{\partial(1 + \xi^2 g^2 + \rho^2 - 2\xi g \cos\theta - 2\xi g \rho \sin(\theta))}{\partial \xi} = 0$$

$$\frac{\partial \left|\hat{Z}[-k]\right|^2}{\partial \rho} = \frac{\partial(1 + \xi^2 g^2 + \rho^2 - 2\xi g \cos\theta - 2\xi g \rho \sin(\theta))}{\partial \rho} = 0$$

$$2\xi g^2 - 2g \cos\theta - 2\rho g \sin(\theta) = 0$$

$$2\rho - 2\xi g \sin(\theta) = 0$$

Solving the above yields $$\begin{bmatrix} g^2 & -g\sin(\theta) \\ -g\sin(\theta) & 1 \end{bmatrix} \begin{bmatrix} \xi \\ \rho \end{bmatrix} = \begin{bmatrix} g\cos\theta \\ 0 \end{bmatrix}$$

$$\begin{bmatrix} \xi \\ \rho \end{bmatrix} = \frac{1}{(g\cos\theta)^2} \begin{bmatrix} g\cos\theta \\ g^2 \sin\theta\cos\theta \end{bmatrix} = \begin{bmatrix} \frac{1}{g\cos\theta} \\ \tan\theta \end{bmatrix}$$

It is easy to show that such a selection actually brings the energy at bin −k to 0 and thus completely cancels the I/Q imbalance effects. Our goal now is to estimate the I/Q imbalance parameters from probe2 transmissions.

I/Q Parameter Estimation

Since I/Q imbalance corrupts the incoming signal it results in corrupted carrier frequency estimation as well as corrupted channel estimation. The channel estimation under I/Q imbalance is given by;

$$\hat{h}_k = \frac{A_k^*}{N|A_k|^2} \hat{Z}[k] = |h| e^{j\angle h} K_1 + e_k$$

The FFT output at bins k and −k without I/Q compensation but after frequency compensation assuming a frequency estimation error of $\epsilon$ is given by $$Z[k] = |h| e^{j\angle h} K_1 e^{j\pi\varepsilon(N-1)} \frac{\sin(\pi\varepsilon N)}{\sin(\pi\varepsilon)} +$$

$$|h| e^{-j\angle h} K_2 e^{-j2\pi(N-1)\left(\frac{k}{N}+\varphi-\frac{1}{2}\varepsilon\right)} \frac{\sin\left(2\pi N\left(\frac{k}{N}+\varphi-\frac{1}{2}\varepsilon\right)\right)}{\sin\left(2\pi\left(\frac{k}{N}+\varphi-\frac{1}{2}\varepsilon\right)\right)} + W_k$$

$$Z[-k] = |h| e^{-j\angle h} K_2 e^{-j2\pi\left(\varphi-\frac{1}{2}\varepsilon\right)(N-1)} \left( \frac{\sin\left(2\pi N\left[\varphi-\frac{1}{2}\varepsilon\right]\right)}{\sin\left(2\pi\left[\varphi-\frac{1}{2}\varepsilon\right]\right)} \right) +$$

$$|h| e^{j\angle h} K_1 e^{-j2\pi\left(\frac{k}{N}+\frac{1}{2}\varepsilon\right)(N-1)} \left( \frac{\sin\left(2\pi N\left[\frac{k}{N}+\frac{1}{2}\varepsilon\right]\right)}{\sin\left(2\pi\left[\frac{k}{N}+\frac{1}{2}\varepsilon\right]\right)} \right) + W_{-k}$$

Effects of Carrier Frequency Offset Greater than 50 Khz

In the absence of carrier frequency error the image component resulting from the I/Q imbalance appears exactly at the mirror digital frequency (−k/N) of the transmitted tone. Under carrier frequency error (which is mandatory during probe II) the I/Q image appears at a digital frequency of (−k/N−2φ), where φ is the normalized carrier frequency error which is φ=Carrier Frequency Error/SymbolRate=Δfc/fs. The carrier frequency error can be as large as ±200 ppm of 1.5e9 Hz=300 kkHz. While the OFDM tone spacing is 50e6/256=195.3 kHz. Thus the image component can fall somewhere between [−k−3, k+3] interval in the frequency domain. The FFT output for bin −k+i is given by $$Z[-k+i] = |h| e^{-j\angle h} K_2 e^{-j2\pi\left(\varphi-\frac{1}{2}\varepsilon+\frac{1}{2N}i\right)(N-1)} \left( \frac{(-1)^i \sin\left(2\pi N\left[\varphi-\frac{1}{2}\varepsilon\right]\right)}{\sin\left(2\pi\left[\varphi-\frac{1}{2}\varepsilon+\frac{1}{2N}i\right]\right)} \right) +$$

-continued $$|h|e^{\iota h}K_1 e^{-j\pi\left(\frac{2k-i}{N}+\varepsilon\right)(N-1)}\left(\frac{\sin\left(\pi N\left[\frac{2k-i}{N}+\varepsilon\right]\right)}{\sin\left(\pi\left[\frac{2k-i}{N}+\varepsilon\right]\right)}\right) + W_{-k+i}$$

And so due to the fact that the compensated frequency error φ results in a shift of 2φ in the location of the image, we need to collect the image energy from the interval [−k−3, . . . , k+3]. Pragmatically since we know the frequency error φ (up to ε) we know that the image will appear at a digital frequency of $$-\left(\frac{k+M}{N}+r\right), 2\varphi = \frac{M}{N} + r \text{ where } M = \lfloor 2\varphi N \rfloor \text{ and } |r| < \frac{1}{N}.$$

The loss of image energy in [dB] with respect to the image energy is a function of the number of bins used to collect energy and given by:

$$\text{Loss} = 10\log_{10} N^2 - 10\log_{10}\left(\sum_{i=-M-L}^{-M+L}\left(\frac{\sin(\pi[M+Nr])}{\sin\left(\pi\left[\frac{M+i}{N}+r\right]\right)}\right)^2\right)$$

Figure 11:
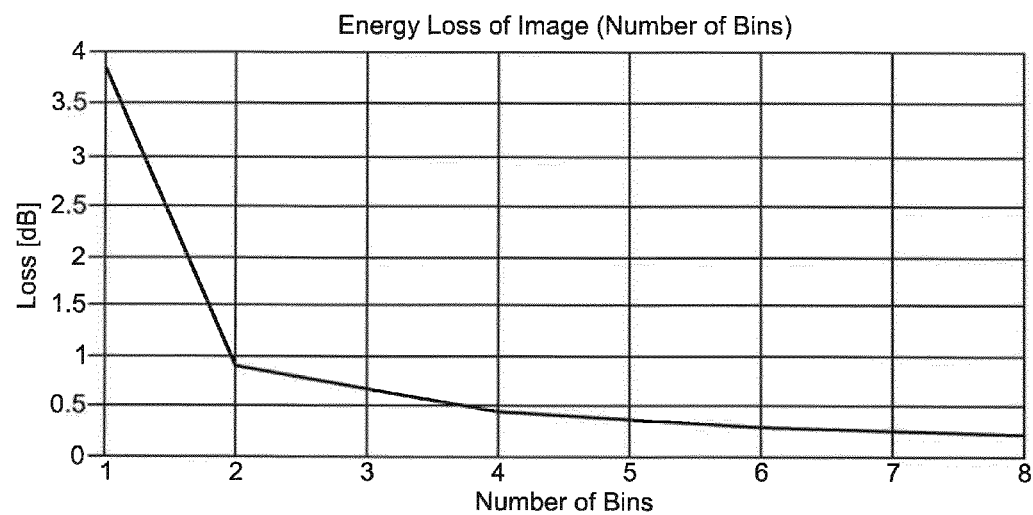
FIG. 11 shows an illustrative Energy Loss of Image Figure as a function of the number of bins used.

The worst case loss is experienced when the image falls midway between bins (r=1/(2N)). Using just one bin which is closest to the image results in a worst case loss of 3.9223[dB] using two bins results in a loss of 0.9120[dB] FIG. 11 summarizes the loss as a function of the number of bins used.

We shall use 2 bins seems like a reasonable trade-off between complexity and performance.

FFT Processing of Probe2 (Single OFDM Symbol)

For simplicity consider a single OFDM symbol the extension to multi OFDM symbols will be given shortly after. We have shown that the FFT outputs at bins k and −k are given by $$Z[k] = \overbrace{A_1 h K_1}^{\text{signal term}} + \underbrace{B_1 h^* K_2}_{\text{ICI from bin}-k} + W_k$$

$$Z[-k] = \underbrace{A_2 h K_1}_{\text{ICI from bin }k} + \overbrace{B_2 h^* K_2}^{\text{signal term}} + W_{-k}$$

It is easy to show that each expression is composed of an expected signal term and an ICI term from the mirror frequency. We shall now show that the ICI terms are much smaller than the signal terms and can thus be neglected.

The ICI induced at bin k is due to the fact that the image signal that results from I/Q imbalance is produced at a digital frequency of −k/N−φ' (where φ'=(φ−½ε)) which is not on the FFT grid. The further away this frequency is from the FFT grid of 1/N the larger the ICI. Since k is restricted to be in the interval {[146,186],[217,249]} the image is produced far away from the desired signal and the ICI noise it produces at frequency k/N is very small. To see this considers the ratio between the signal and ICI terms at bin k. We denote this ratio as the SNR between the desired and ICI terms and it is given by:

$$SNR_k = 10\log_{10}\left(\frac{|hNK_1|^2}{\left|h^* e^{-j\left(2\pi(N-1)\left(\frac{k}{N}+\varphi'\right)\right)}\frac{\sin(2\pi\varphi'N)}{\sin\left(\frac{2\pi k}{N}+2\pi\varphi'\right)}K_2\right|^2}\right) =$$

$$10\log_{10}\left(\frac{N^2|K_1|^2}{|K_2|^2}\right) - 10\log_{10}\left(\left[\frac{\sin(2\pi\varphi'N)}{\sin\left(\frac{2\pi k}{N}+2\pi\varphi'\right)}\right]^2\right)$$

The worst case SNR is found by minimizing the above expression with respect to {g, θ, k, φ'}. It is easy to show that minimizing the above expression is separable and thus minimization is achieved by
- minimizing the first term with respect to g and θ under the constraint that g∈[0.5,2] (max 3[dB] amplitude imbalance) and θ∈[−10°,10°]
- maximizing the second term under the constraint that φ'∈ [−200e−6*1.5e9/50e6:−200e−6*1.5e9/50e6] and k∈[146:186, 217:249]

Figure 12A:
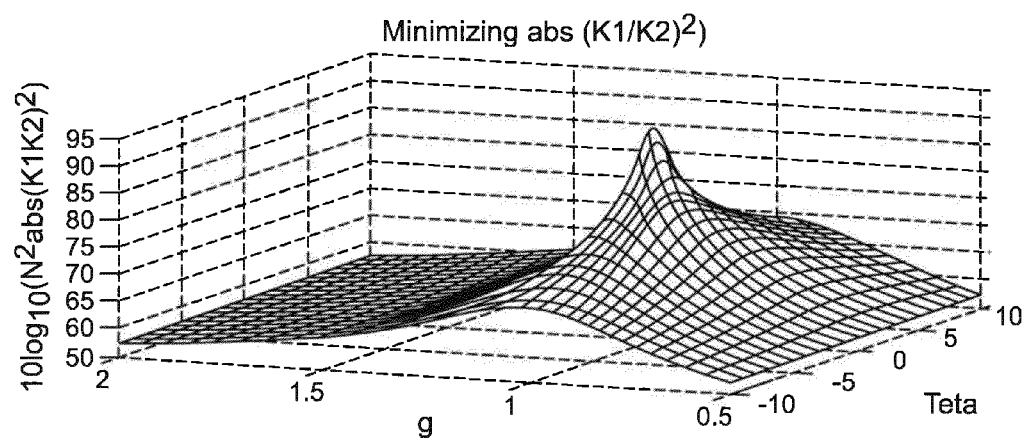
FIG. 12B shows various illustrative plots.

The above minimizations were performed numerically using a Matlab simulation. FIG. 12a depicts the first term as a function of g and θ

It is easy to see (analytically as well) that the minimum is at the edges of the argument interval namely for g=0.5,2 and Teta=±10° and thus $$57.4216 = \min_{g,\theta}\left\{10\log_{10}\left(\frac{N^2|K_1(g,\theta)|^2}{|K_2(g,\theta)|^2}\right)\right\} st \begin{array}{l} g \in [0.5, 2] \\ \theta \in [-10°, 10°] \end{array}$$

Figure 12B:
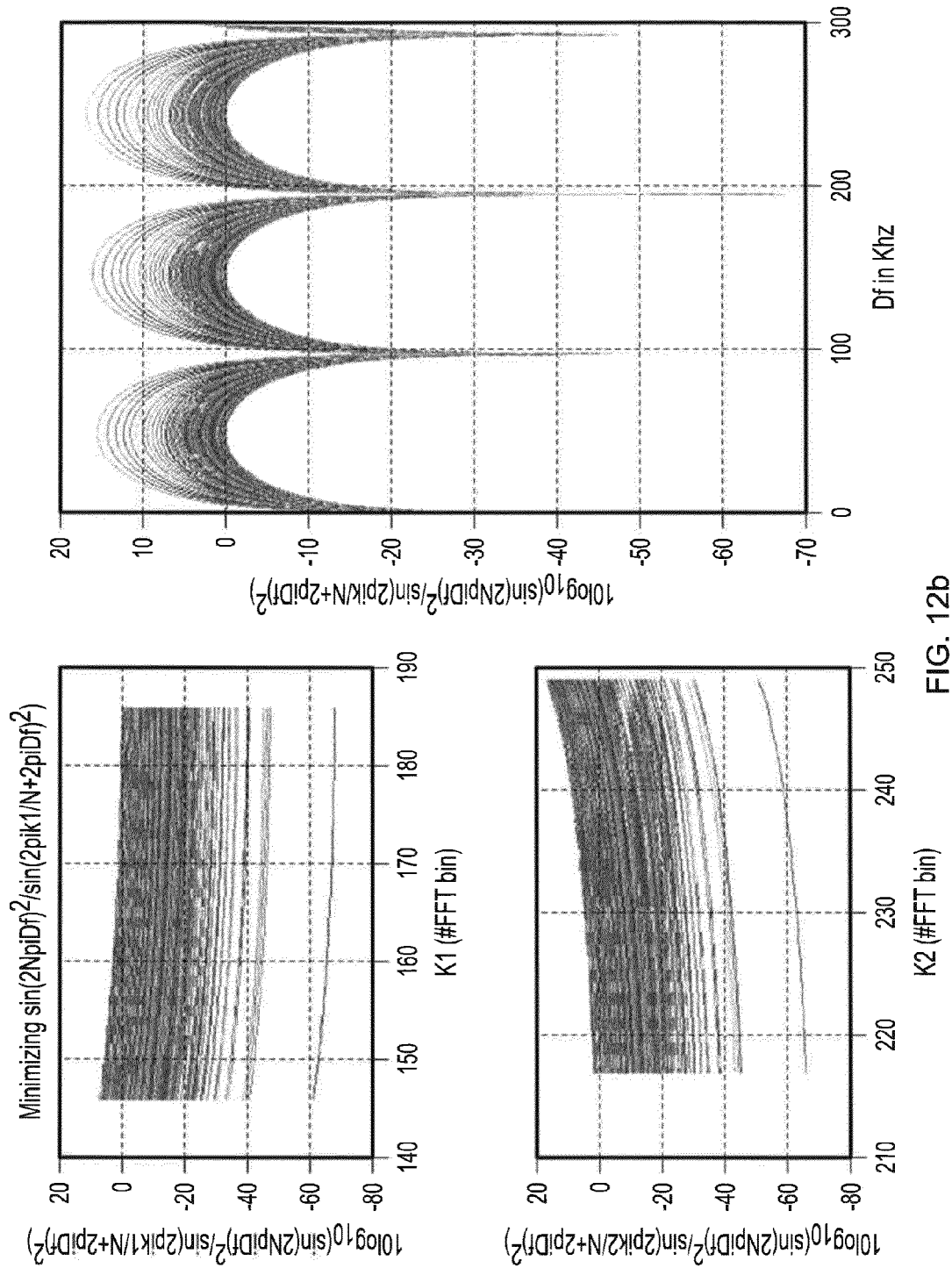

FIG. 12b depicts the second term as a function of φ and k

Figure 13:
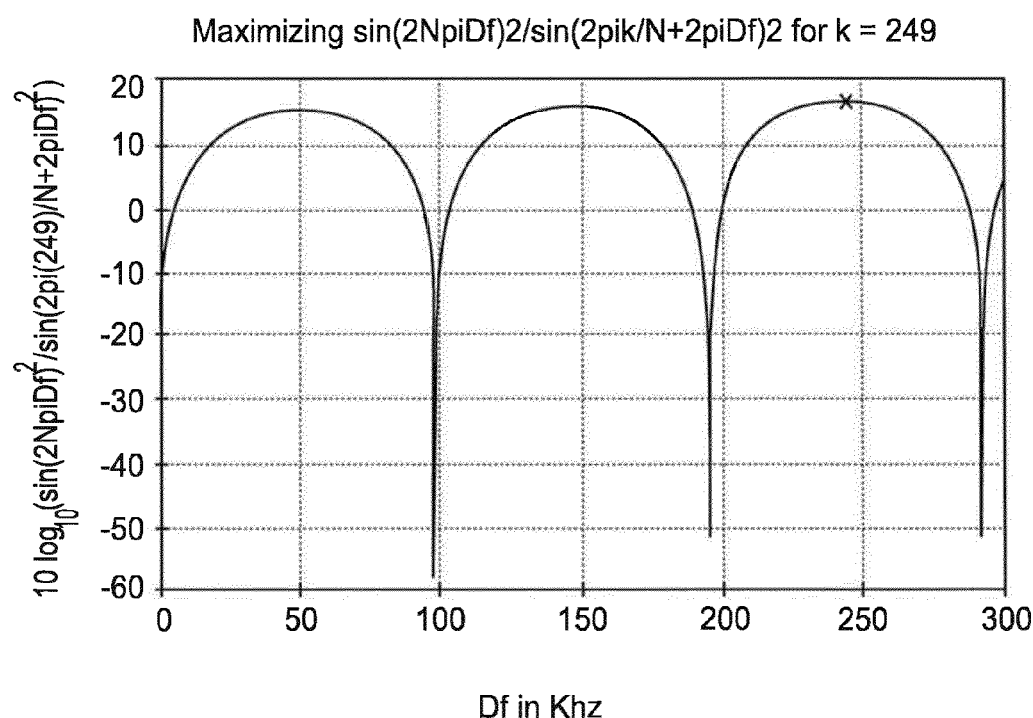
FIG. 13 shows an illustrative maximization plot.

From FIG. 12b it is easy to see that the second term is maximized for k=249, for such a k the second term is depicted in FIG. 13.

Maximum is achieved for Df=±245 Khz and thus $$17.04 =$$

$$\max_{g,\theta}\left\{10\log_{10}\left(\left[\frac{\sin(2\pi\varphi N)}{\sin\left(\frac{2\pi k}{N}+2\pi\varphi\right)}\right]^2\right)\right\} st \begin{array}{l} \varphi \in [-\Delta f, \Delta f] \\ k \in [146, 186] \cup [217, 249] \end{array}$$

Thus the worst case SNR induced by the ICI term is 40.3816 [dB]

$$40.3816[dB] = \min(SNR_k) =$$

$$\min_{\varphi,k,g,\theta}\left(10\log_{10}\left(\frac{N^2|K_1(g,\theta)|^2}{|K_2(g,\theta)|^2}\right) - 10\log_{10}\left(\left[\frac{\sin(2\pi\varphi N)}{\sin\left(\frac{2\pi k}{N}+2\pi\varphi\right)}\right]^2\right)\right)$$

Thus the ICI term is at the worst case 40[dB] below the signal term and so can be neglected. A similar analysis can be performed for the negative bins. The FFT outputs at bins k and −k+i after neglecting the ICI terms is given by:

$$Z[k] = hAK_1 + W_k$$

$$Z[-k+i] = h^* B_1 K_2 + W_{-k+i}$$

-continued $$A = e^{j\pi\varepsilon(N-1)} \frac{\sin(\pi\varepsilon N)}{\sin(\pi\varepsilon)}$$

$$B_i = e^{-j2\pi(\varphi - \frac{1}{2}\varepsilon + \frac{i}{2N})(N-1)} \left( \frac{(-1)^i \sin\left(2\pi N\left[\varphi - \frac{1}{2}\varepsilon\right]\right)}{\sin\left(2\pi\left[\varphi - \frac{1}{2}\varepsilon + \frac{i}{2N}\right]\right)} \right)$$

Since we cannot estimate the channel response h we cannot solve a linear LS problem for $ge^{-j\theta}$, instead we first solve a LS problem for the estimation of $hK^*_2$ from the two negative bins $-k+i1$ and $-k+i2$ $$\begin{bmatrix} \hat{Z}^*[-k+i_1] \\ \hat{Z}^*[-k+i_2] \end{bmatrix} = \begin{bmatrix} B_1^* \\ B_2^* \end{bmatrix}(hK_2^*) + \begin{bmatrix} W^*_{k+i_1} \\ W^*_{k+i_2} \end{bmatrix}$$

$$(hK_2^*)_{LS} = \frac{B_1 \hat{Z}^*[-k+i_1] + B_2 \hat{Z}^*[-k+i_2]}{|B_1|^2 + |B_2|^2}$$

Thus we can estimate $$\frac{K_1}{K_2^*}$$

without knowledge of the channel h by $$C \equiv \frac{\overline{K_1}}{K_2^*} = \frac{(hK_1)}{(hK_2^*)_{LS}} = \frac{\frac{Z[k]}{A}}{\frac{B_1 \hat{Z}^*[-k+i_1] + B_2 \hat{Z}^*[-k+i_2]}{|B_1|^2 + |B_2|^2}} = \frac{(|B_1|^2 + |B_2|^2) \cdot Z[k]}{A \cdot (B_1 \hat{Z}^*[-k+i_1] + B_2 \hat{Z}^*[-k+i_2])}$$

Since probe2 is composed of two tones one at k1 and the other at k2 we can average the result from these two tones and thus $$\overline{C} \equiv \frac{1}{2} \frac{(|B_1|^2 + |B_2|^2) \cdot Z[k_1]}{A \cdot (B_1 \hat{Z}^*[-k_1+i_1] + B_2 \hat{Z}^*[-k_1+i_2])} +$$

$$\frac{1}{2} \frac{(|B_1|^2 + |B_2|^2) \cdot Z[k_2]}{A \cdot (B_1 \hat{Z}^*[-k_2+i_1] + B_2 \hat{Z}^*[-k_2+i_2])}$$

It is easy to see that $$ge^{-j\theta} = \frac{K_1/K_2^* - 1}{K_1/K_2^* + 1}$$

And thus its estimate is given by $$\overline{ge^{-j\theta}} = \frac{\overline{C} - 1}{\overline{C} + 1}$$

The I/Q compensation is then easily computed by $$\hat{\xi} = \frac{1}{\text{real}\{\overline{ge^{-j\theta}}\}}$$

$$\hat{\rho} = -\frac{\text{imag}\{\overline{ge^{-j\theta}}\}}{\text{real}\{\overline{ge^{-j\theta}}\}}$$

FFT Processing of Probe2 (Multi OFDM Symbol)

When looking at multiple OFDM symbols we need to take into account the phase error induced by the accumulation of the residual frequency error ε. It is easy to show that the phase of the m'th OFDM symbol relative to the first one is given by $$Z[k,m] = \begin{cases} k \geq 0 & e^{j2\pi\varepsilon(N+N_{CP})m}Z[k,0] \\ k < 0 & e^{j2\pi(2\varphi-\varepsilon)(N+N_{CP})m}Z[k,0] \end{cases}$$

Note that the above does not take into account the sampling frequency error its effect is assumed to be small and was neglected throughout the analysis.

The phase accumulated from the starting time of carrier frequency compensation to the start of the first FFT window should be accounted for. Since our algorithm computed the ratio between Zk and conj(Z−k) any constant phase term will not cancel out but on the contrary double itself.

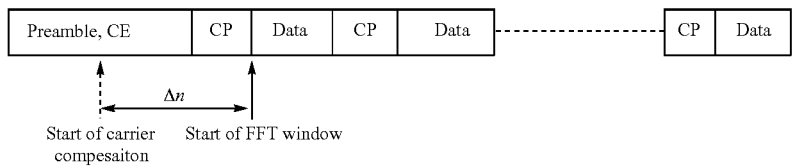

Thus the FFT output at bins +k, −k+i for the m'th OFDM symbol is given by $$Z[k] = \underbrace{D}_{\#1} \underbrace{e^{-j2\pi\Delta n(\varphi-\varepsilon)}}_{\#2} \underbrace{e^{j2\pi\varepsilon(N+N_{CP})in}}_{\#3} hAK_i + W_k$$

$$Z[-k+i] = \underbrace{D^*}_{\#1} \underbrace{e^{-j2\pi\Delta n(\varphi-\varepsilon)}}_{\#2} \underbrace{e^{j2\pi(2\varphi-\varepsilon)(N+N_{CP})m}}_{\#3} h^* B_i K_2 + W_{-k+1}$$

1 – due to $\Delta n$ samples between start of compensation to FFT will not cancell out

2 – due to $\Delta n$ samples between start of compensation to FFT start will not cancel out

3 = Phase due to residual carrier freq error

Residual Carrier Frequency Estimation

To use the information from all L OFDM symbols we need to compensate for the residual frequency offset $\epsilon$ and then compute the average of the compensated signals form each bin to reduce the AWGN variance. Since $\epsilon$ can be large enough such that phase wrapping can occur several times during the L OFDM symbols we propose the following estimator which is immune to phase wrapping (as long as no more than one wrap occurs between two consecutive samples which is the case here).

Residual Frequency Estimation

The residual frequency error estimate may be computed by $$\hat{\varepsilon} = \frac{\text{angle}\left(\sum_{m=0}^{L-2} Z[k_i, m] Z^*[k_i, m+1]\right)}{2\pi(N + N_{CP})}$$

Where $k_i = \begin{cases} k_1 & SNR_{k_1} > SNR_{k_2} \\ k_2 & SNR_{k_2} > SNR_{k_1} \end{cases}$ The residual frequency error compensation and averaging is given by Residual Frequency Compensation and time averaging $$\bar{Z}_{k_1} = \sum_{m=0}^{L-1} Z[k_1, m] e^{-j2\pi\hat{\varepsilon}(N+N_{CP})m}$$

$$\bar{Z}_{-k_1+i_1} = \sum_{m=0}^{L-1} Z[-k_1+i_1, m] e^{-j2\pi(2\hat{\varphi}+\hat{\varepsilon})(N+N_{CP})m}$$

$$\bar{Z}_{-k_1+i_2} = \sum_{m=0}^{L-1} Z[-k_1+i_2, m] e^{-j2\pi(2\hat{\varphi}+\hat{\varepsilon})(N+N_{CP})m}$$

$$\bar{Z}_{k_2} = \sum_{m=0}^{L-1} Z[k_2, m] e^{-j2\pi\hat{\varepsilon}(N+N_{CP})m}$$

$$\bar{Z}_{-k_2+i_1} = \sum_{m=0}^{L-1} Z[-k_2+i_1, m] e^{-j2\pi(2\hat{\varphi}+\hat{\varepsilon})(N+N_{CP})m}$$

$$\bar{Z}_{-k_2+i_2} = \sum_{m=0}^{L-1} Z[-k_2+i_2, m] e^{-j2\pi(2\hat{\varphi}+\hat{\varepsilon})(N+N_{CP})m}$$

The phasor $ge^{-j\theta}$ can then be estimated using the same estimator derived above, namely $$C_i = e^{j4\pi(\varphi-\varepsilon)(\Delta n)} \frac{(|B_1|^2 + |B_2|^2) \cdot \bar{Z}_{k_1}}{B_1(\bar{Z}_{-k_1+i_1})^* + B_2(\bar{Z}_{-k_1+i_2})^*}$$

Where the phase term $e^{j4\pi(\Phi-\epsilon)(\Delta n)}$ compensates for the initial phase error accumulated from the start time of frequency compensation till the start of the first FFT window. Simplification of the Coefficients Bi and A For pragmatic implementation we need to simplify the expressions of Bi and A, simplification can be obtained by introducing some approximations. Let's look at $$A = e^{j\pi\varepsilon(N-1)} \frac{\sin(\pi\varepsilon N)}{\sin(\pi\varepsilon)}$$

The residual frequency error is typically smaller then 10 khz (7 ppm) for such an error $$e^{j\pi\varepsilon(N-1)} = 0.9872 + 0.1595i \cong 1$$

$$\frac{\sin(\pi\varepsilon N)}{\sin(\pi\varepsilon)} = 254.8975 \cong 256 = N$$

Thus we make the following approximation $$A = e^{j\pi\varepsilon(N-1)} \frac{\sin(\pi\varepsilon N)}{\sin(\pi\varepsilon)} \cong N$$

As for Bi $$B_i = e^{-j2\pi\left(\varphi - \frac{1}{2}\varepsilon + \frac{i}{2N}\right)(N-1)} \left(\frac{(-1)^i \sin\left(2\pi N\left[\varphi - \frac{1}{2}\varepsilon\right]\right)}{\sin\left(2\pi\left[\varphi - \frac{1}{2}\varepsilon + \frac{i}{2N}\right]\right)}\right)$$

$$\cong e^{-j2\pi\left(\varphi - \frac{1}{2}\varepsilon\right)(N)} e^{-j\pi i} \left(\frac{(-1)^i \sin\left(2\pi N\left[\varphi - \frac{1}{2}\varepsilon\right]\right)}{\sin\left(2\pi\left[\varphi - \frac{1}{2}\varepsilon + \frac{i}{2N}\right]\right)}\right)$$

$$\cong e^{-j2\pi N(\varphi-\varepsilon)} (-1)^{2i} \left(\frac{\sin(2\pi N[\varphi-\varepsilon])}{\sin\left(2\pi\left[\varphi - \varepsilon + \frac{i}{2N}\right]\right)}\right)$$

$$= e^{-j2\pi N(\varphi-\varepsilon)} \left(\frac{\sin(2\pi N[\varphi-\varepsilon])}{\sin\left(2\pi\left[\varphi - \varepsilon + \frac{i}{2N}\right]\right)}\right)$$

Where $\varphi - \varepsilon = \frac{CFO}{2\pi}$ $$B_i \cong e^{-j2\pi N(\varphi-\varepsilon)} \left(\frac{\sin(2\pi N[\varphi-\varepsilon])}{\sin\left(2\pi\left[\varphi - \varepsilon + \frac{i}{2N}\right]\right)}\right)$$

$$= \frac{\sin(2 \cdot N \cdot CFO) + j[\cos(2 \cdot N \cdot CFO) - 1]}{2\sin\left(2\pi\left[\varphi - \varepsilon + \frac{i}{2N}\right]\right)}$$

Since the frequency shift along with the residual frequency error is smaller than (200+7)ppm and $-3 \leq i \leq 3$ follows that the argument of the sin( ) in the denominator is small $$2\pi\left[\varphi - \varepsilon + \frac{i}{2N}\right] < 207e - 6 * 1.5e9/50e6 + 3/512 = 0.0121$$

For such a small angle a simple linear approximation has very little error $$\sin(0.0121) \cong 0.0121$$

-continued $$\sin\left(2\pi\left[\varphi-\varepsilon+\frac{i}{2N}\right]\right) \cong 2\pi\left[\varphi-\varepsilon+\frac{i}{2N}\right]$$

Thus follows that $$B_i \cong \frac{\sin(2 \cdot N \cdot CFO) + j[\cos(2 \cdot N \cdot CFO) - 1]}{2\sin\left(2\pi\left[\varphi-\varepsilon+\frac{i}{2N}\right]\right)} \cong$$

$$\frac{1}{2} \frac{\sin(2 \cdot N \cdot CFO) + j[\cos(2 \cdot N \cdot CFO) - 1]}{CFO + \frac{i\pi}{N}}$$

And so the simplified coefficients are given by $$A = N$$

$$B_1 = \frac{1}{2}\left(\frac{\sin(2 \cdot CFO \cdot N)}{CFO + \frac{\pi \cdot i_1}{N}}\right) + \frac{j}{2}\left(\frac{\cos(2 \cdot CFO \cdot N) - 1}{CFO + \frac{\pi \cdot i_1}{N}}\right)$$

$$B_2 = \frac{1}{2}\left(\frac{\sin(2 \cdot CFO \cdot N)}{CFO + \frac{\pi \cdot i_2}{N}}\right) + \frac{j}{2}\left(\frac{\cos(2 \cdot CFO \cdot N) - 1}{CFO + \frac{\pi \cdot i_2}{N}}\right)$$

APPENDIX B

Exemplary Measurements

Ideal Channel No AWGN with 200 ppm carrier & sampling frequency offset The following plots summarize simulation results for a 3[dB] amplitude imbalance, 10° phase imbalance, 200 ppm frequency offset, ideal channel and no AWGN. Before RX I/Q compensation routine is invoked the receiver SNR is around 10.1 [dB] as can be seen in the following FIG. 14.

Figure 14:
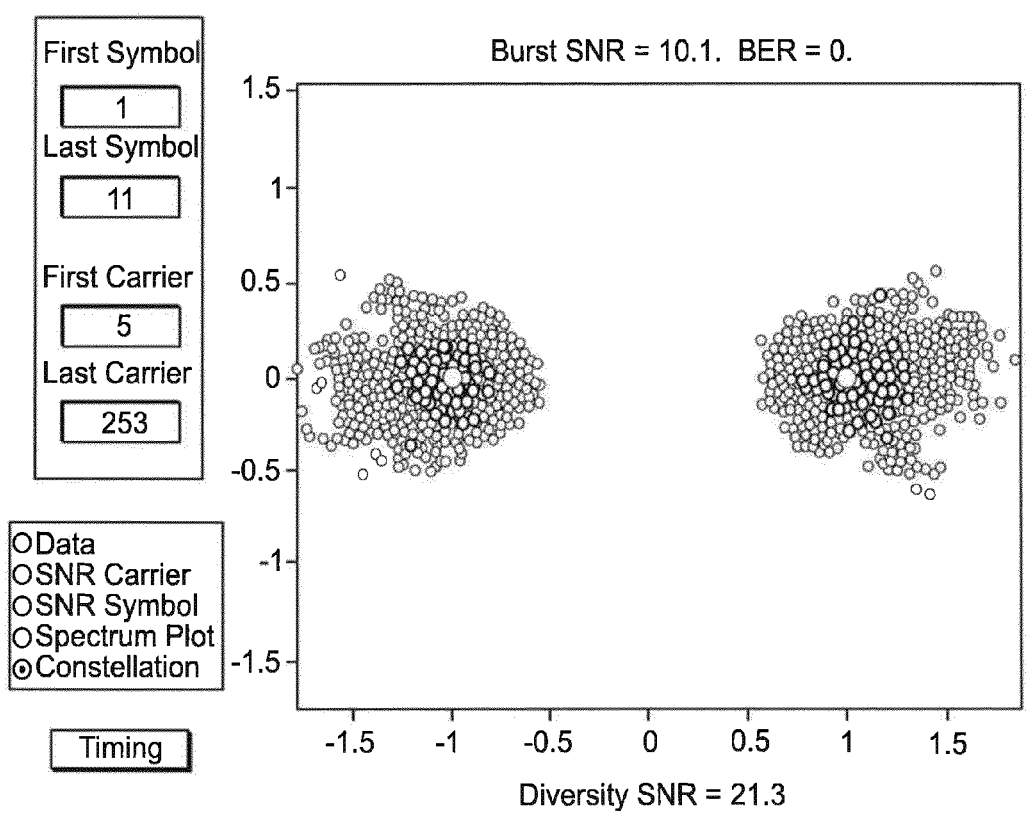
FIG. 14 shows an illustrative plot that summarizes simulation results.

FIG. 14 shows a Slicer input Ideal Channel, no AWGN before cancellation

Figure 16:
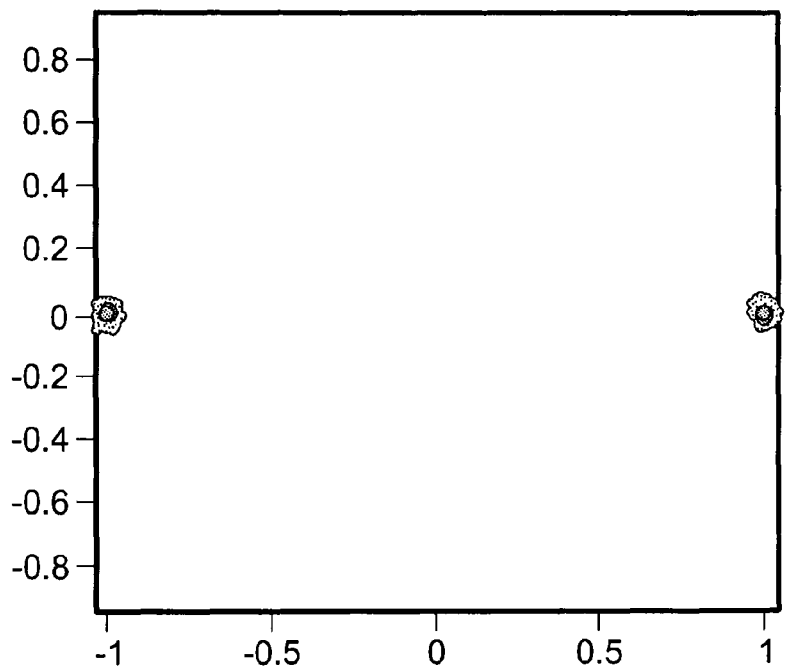
FIG. 16 shows an illustrative plot of a frequency input Ideal Channel, with no AWGN after a first iteration.

After processing of the first probe2, the SNR is around 33[dB]. In FIG. 16, one can compare the image signal magnitude before and after the first iteration.

Figure 17:
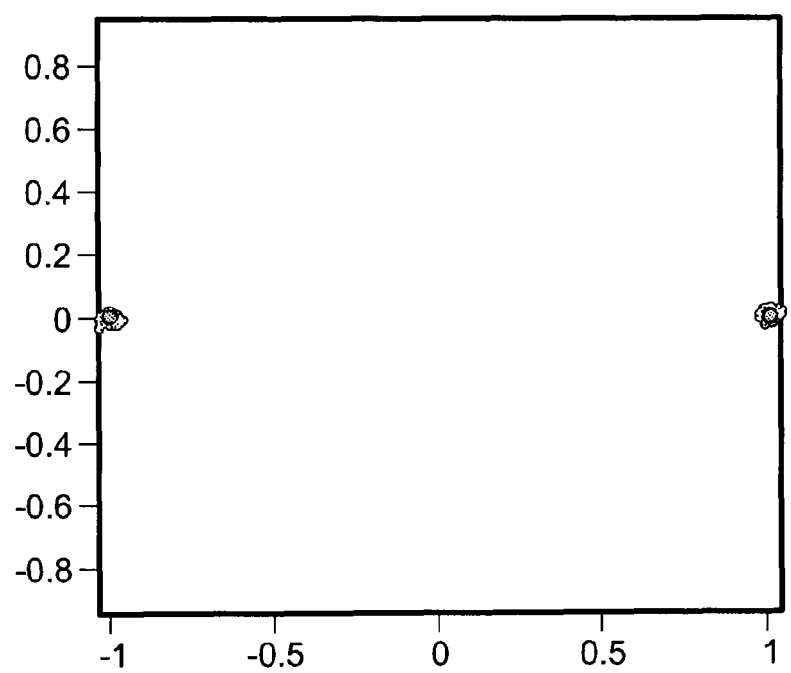
FIG. 17 shows an illustrative plot of a frequency input Ideal Channel, with no AWGN after two iterations.

After processing of the second Probe II, the SNR is around 39.6[dB]. In FIG. 17, one can compare the image signal magnitude before and after the second iteration. The image signal is no longer visible after the second iteration.

Figure 18:
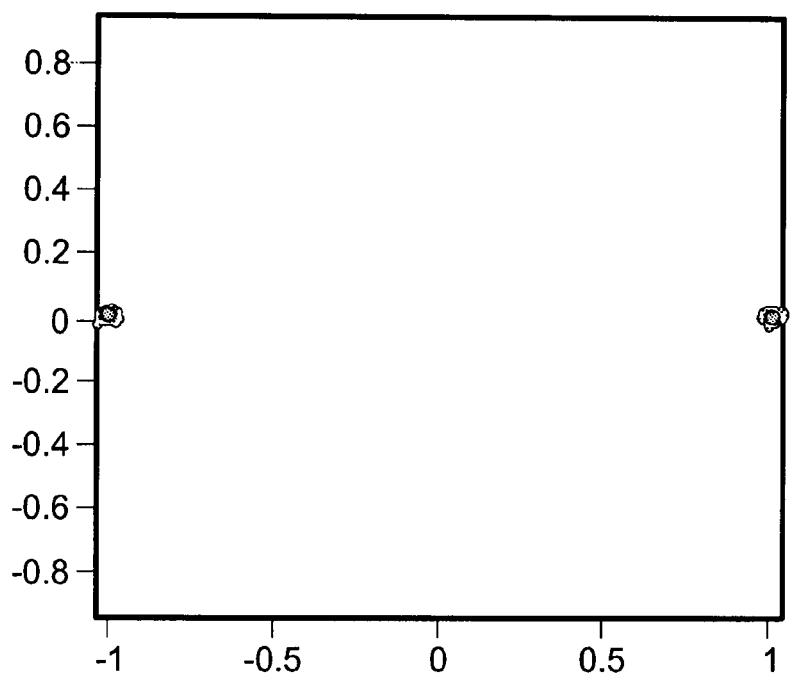
FIG. 18 shows a slicer input Ideal Channel, with no AWGN after three iterations.

After processing of the third Probe II, the SNR is around 40.6[dB], as shown in FIG. 18.

Figure 19:
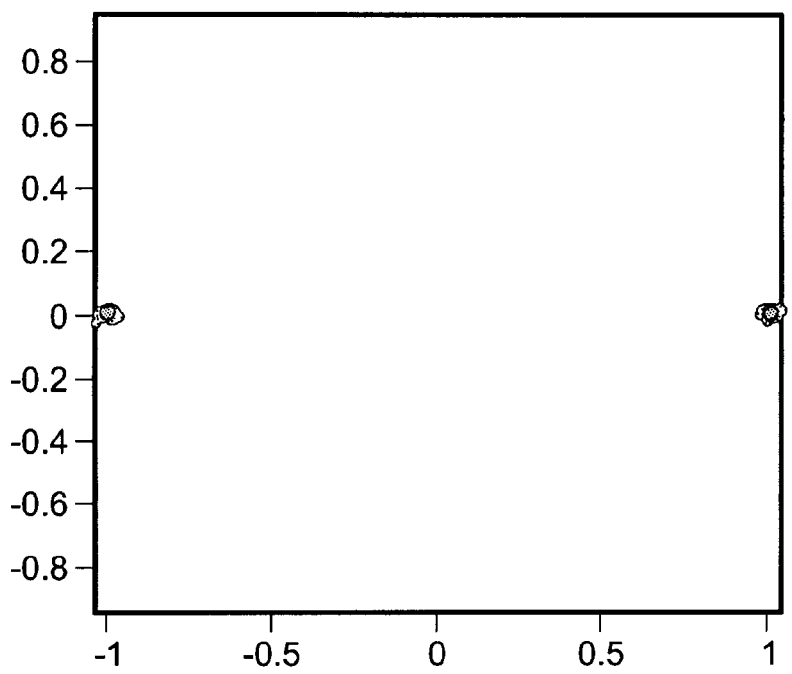
FIG. 19 shows a slicer input Ideal Channel, with no AWGN after four iterations.

FIG. 19 depicts the slicer SNR after processing of the fourth Probe II transmission. SNR is shown to be around 40.9[dB].

Figure 20:
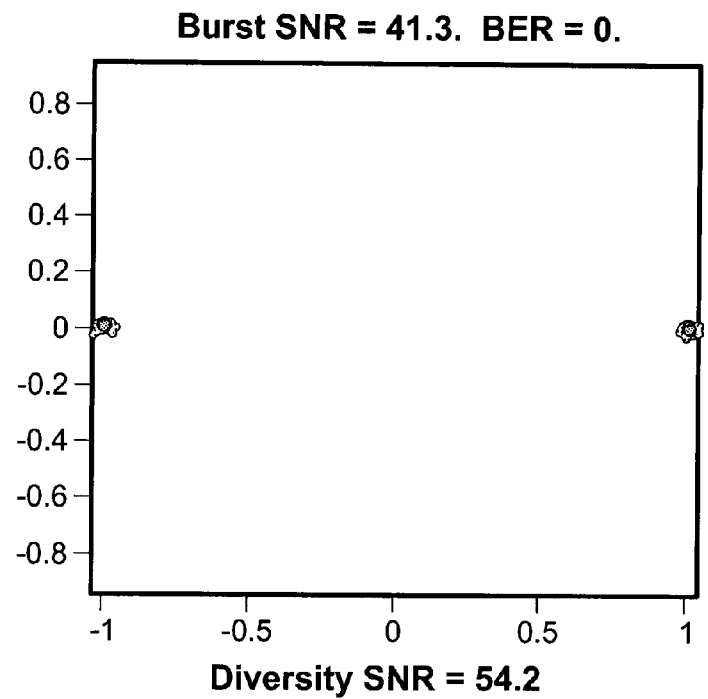
FIG. 20 shows a slicer input Ideal Channel, no AWGN no I/Q imbalance.

FIG. 20 depicts the slicing SNR without I/Q imbalance, the SNR is around 41.3 [dB]. Thus comparing this SNR to that of the SNR obtained after four probe II transmission we can conclude that the residual I/Q imbalance degrades performance by around 0.4[dB] relative to a noise floor of 41.3 [dB].

The I/Q imbalance parameter estimation after each one of the four iterations is summarized in the following table

| Iteration Number | Gain | Theta [°] | Slicer SNR [dB] |
|---|---|---|---|
| True Value | 0.70795 | 10 | 41.3 |
| #0 | 1 | 0 | 10.1 |
| #1 | 0.71345 | 11.4402 | 33 |
| #2 | 0.71103 | 10.3227 | 39.6 |
| #3 | 0.70989 | 10.1742 | 40.6 |
| #4 | 0.70944 | 10.1358 | 40.9 |

Channel MoCA10408, SNR AWGN 15[dB]

The following plots summarize simulation results for a 3[dB] amplitude imbalance, 10° phase imbalance, 200 ppm frequency offset, MoCA10408 channel and 15[dB] AWGN SNR.

Figure 21:
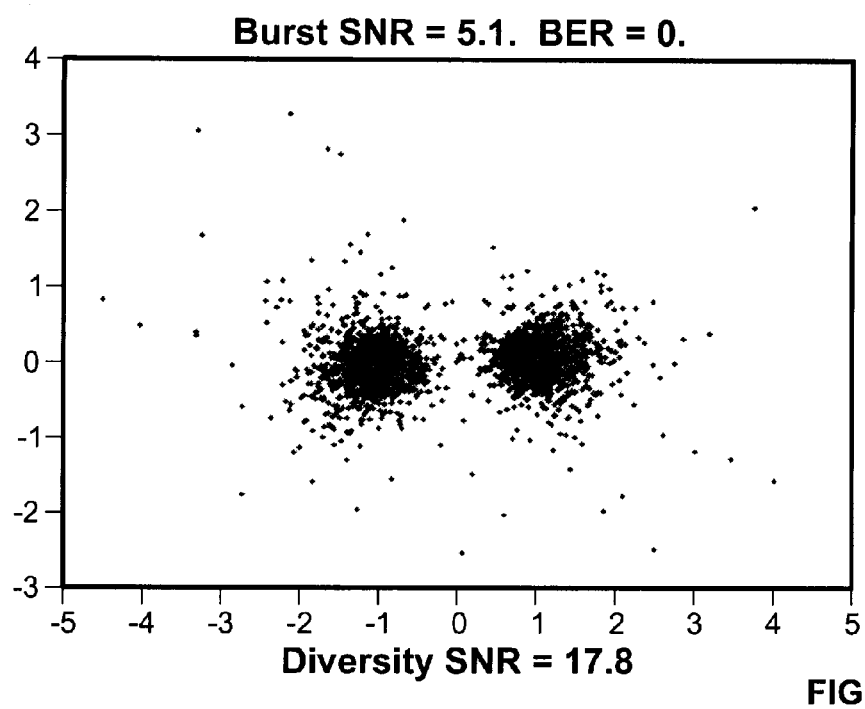
FIG. 21 shows a slicer input MoCA 10408 Channel, 15 [dB] AWGN SNR before cancellation.

Before RX I/Q compensation routine is invoked the receiver SNR is around 5.1 [dB] as can be seen in FIG. 21.

Figure 22:
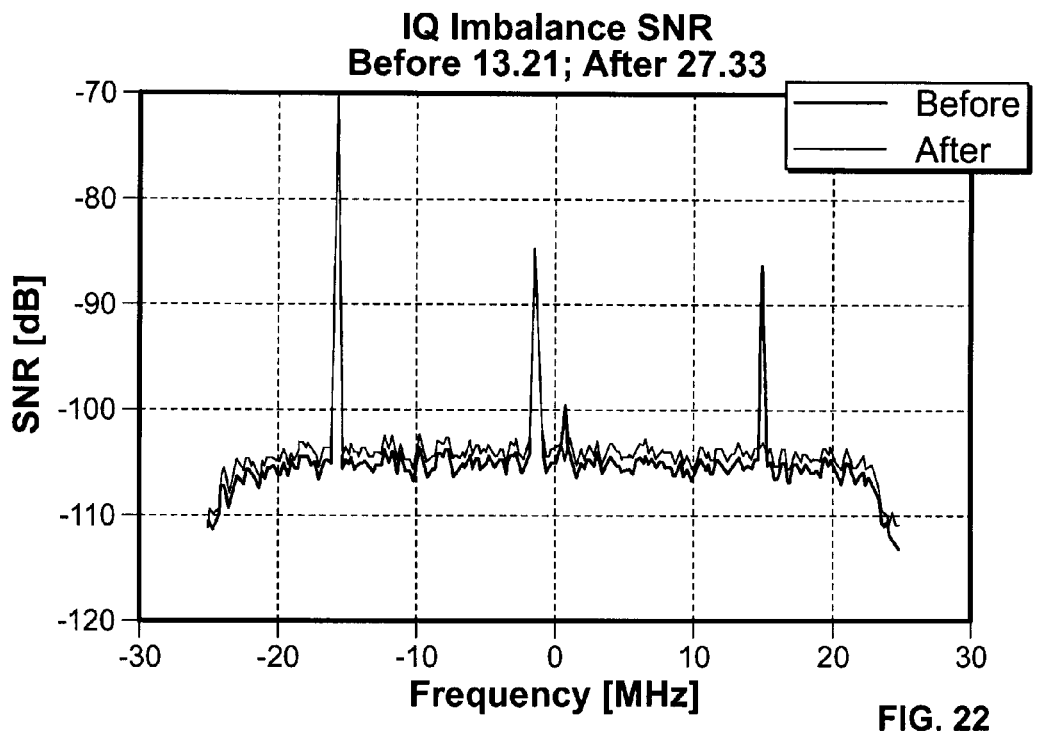
FIG. 22 shows a frequency plot MoCA 10408 Channel, 15 [dB] AWGN SNR after first iteration.

After processing of the first Probe II, the SNR is around 9.5[dB]. In FIG. 22, one can compare the image signal magnitude before and after the first iteration.

Figure 23:
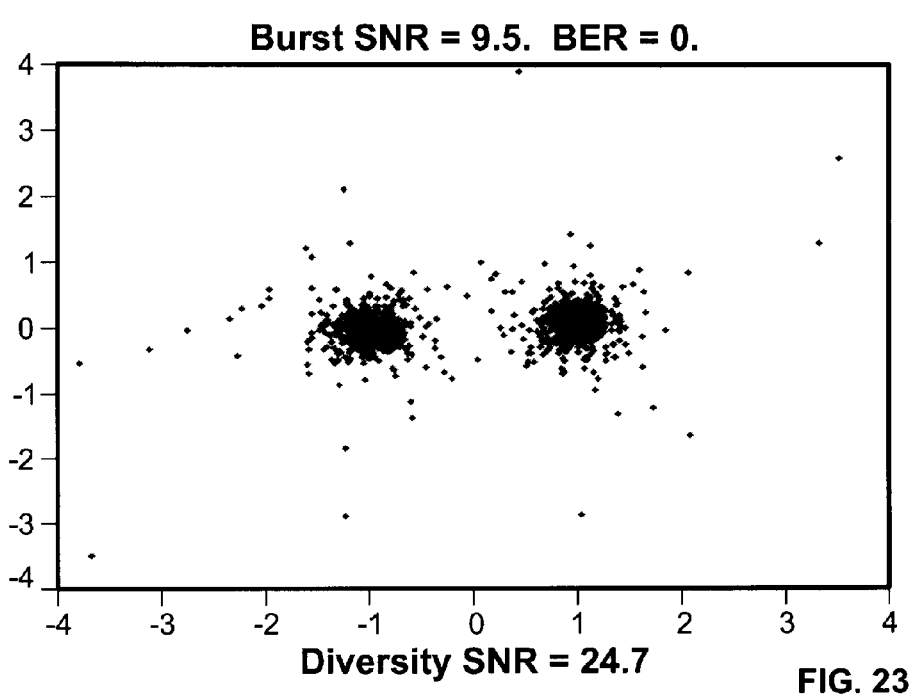
FIG. 23 shows a slicer input MoCA 10408 Channel, 15 [dB] AWGN SNR after first iteration.

FIG. 23 shows slicer input MoCA10408 channel 15[dB] AWGN SNR after first iteration.

Figure 24:
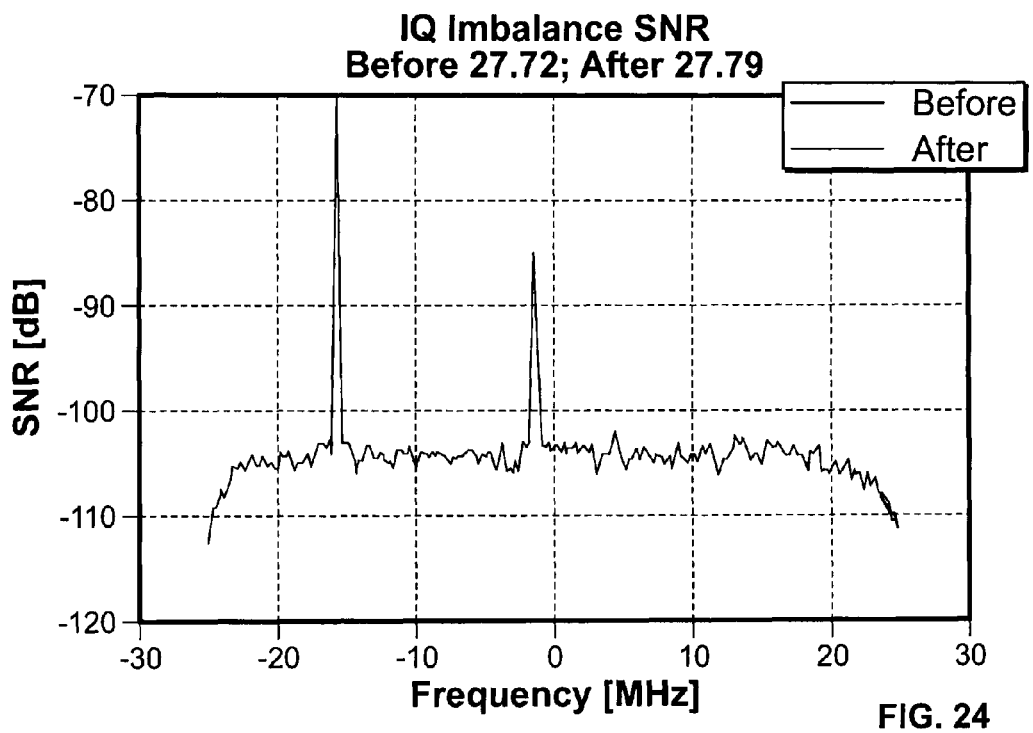
FIG. 24 shows a frequency plot MoCA 10408 Channel, 15 [dB] AWGN SNR after second iteration.

After processing of the second Probe II, the SNR is around 11 [dB], as shown in FIG. 24.

Figure 25:
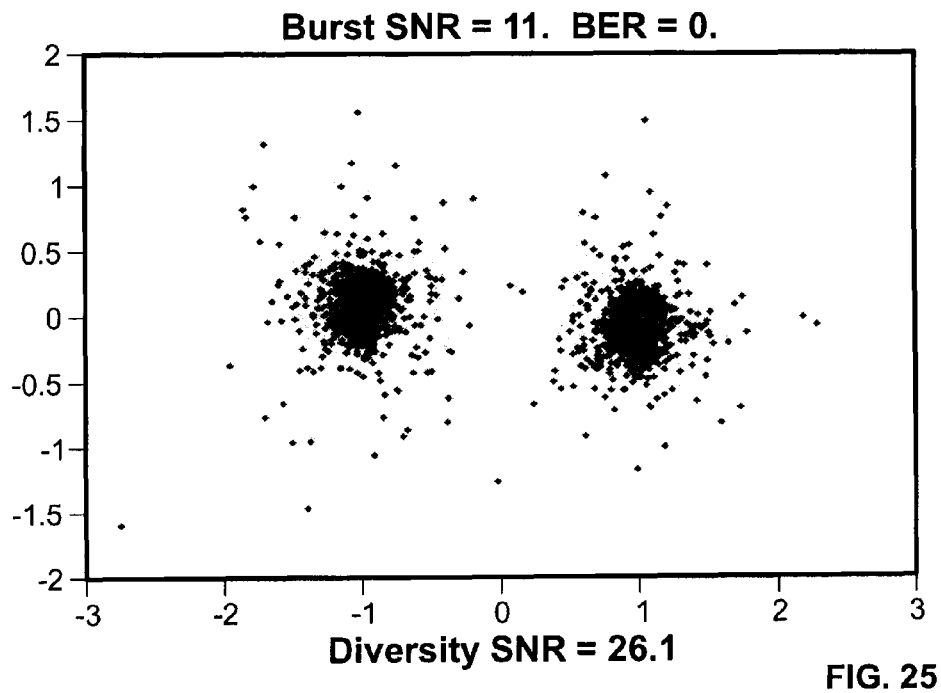
FIG. 25 shows a slicer input MoCA 10408 Channel, 15 [dB] AWGN SNR after second iteration.

FIG. 25 shows slicer input MoCA10408 channel 15[dB] AWGN SNR after second iteration.

Figure 26:
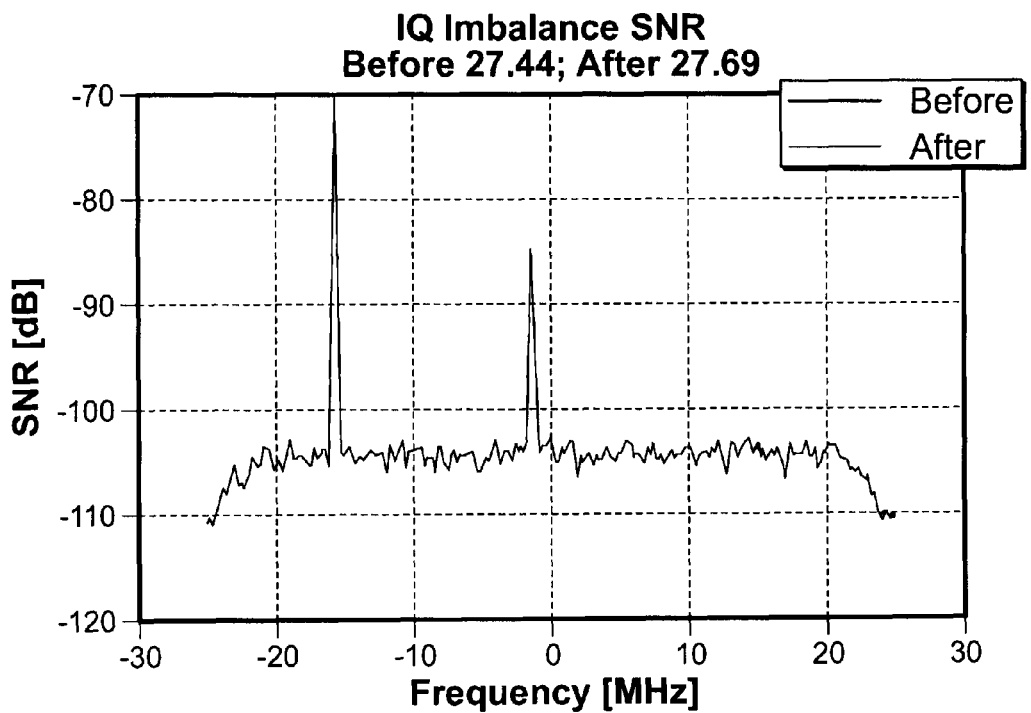
FIG. 26 shows a frequency plot MoCA 10408 Channel, 15 [dB] AWGN SNR after third iteration.

After processing of the third Probe II, the SNR is around 11.6[dB], as shown in FIG. 26.

Figure 27:
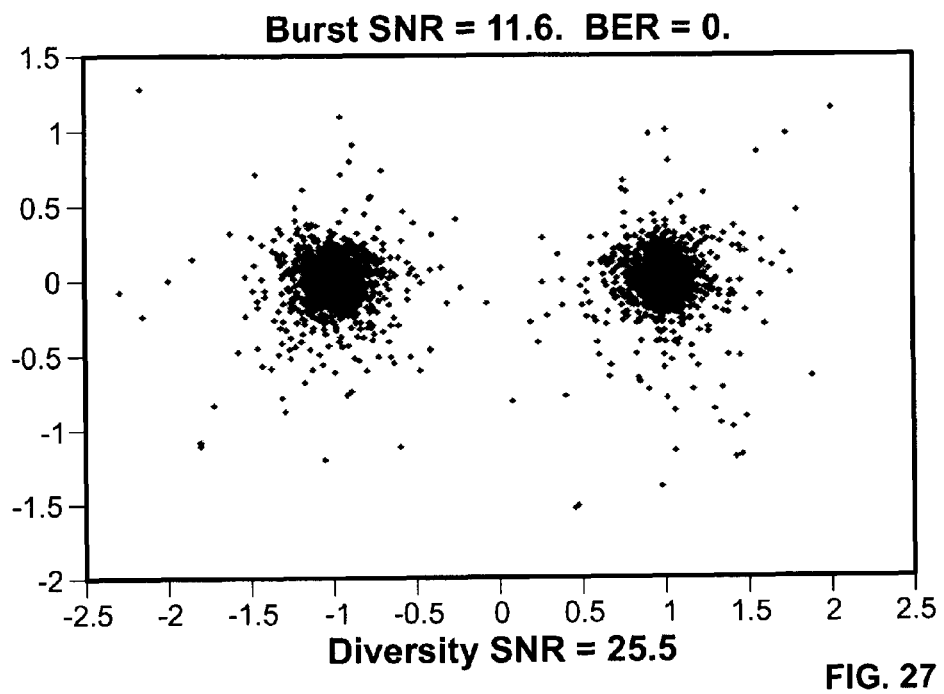
FIG. 27 shows a slicer input MoCA 10408 Channel, 15 [dB] AWGN SNR after third iteration.

FIG. 27 shows slicer input MoCA10408 channel 15[dB] AWGN SNR after second iteration.

Figure 28:
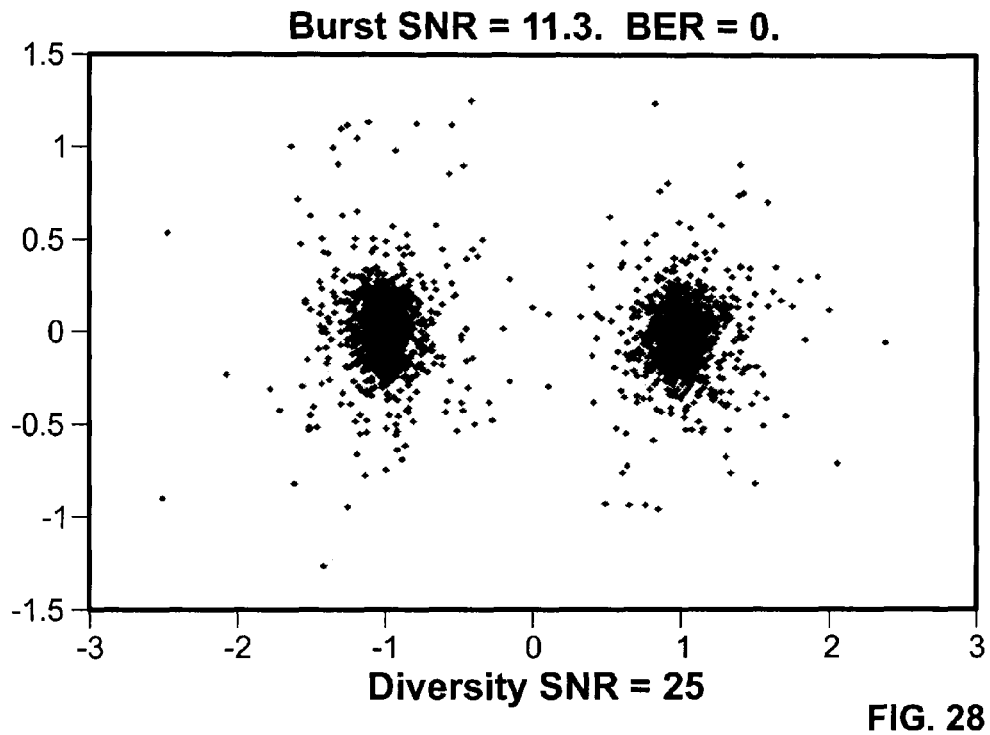
FIG. 28 shows slicer input MoCA 10408 channel 15 [dB] AWGN SNR no I/Q imbalance.

The SNR when no I/Q imbalance is present at the receiver is around 11.3[dB], as shown in FIG. 28. Thus, the residual I/Q imbalance is well below the noise floor of our demodulator and the estimation and compensation algorithm is robust even under harsh channel conditions.

Decoupling of TX and RX I/Q Imbalance

Figure 29:
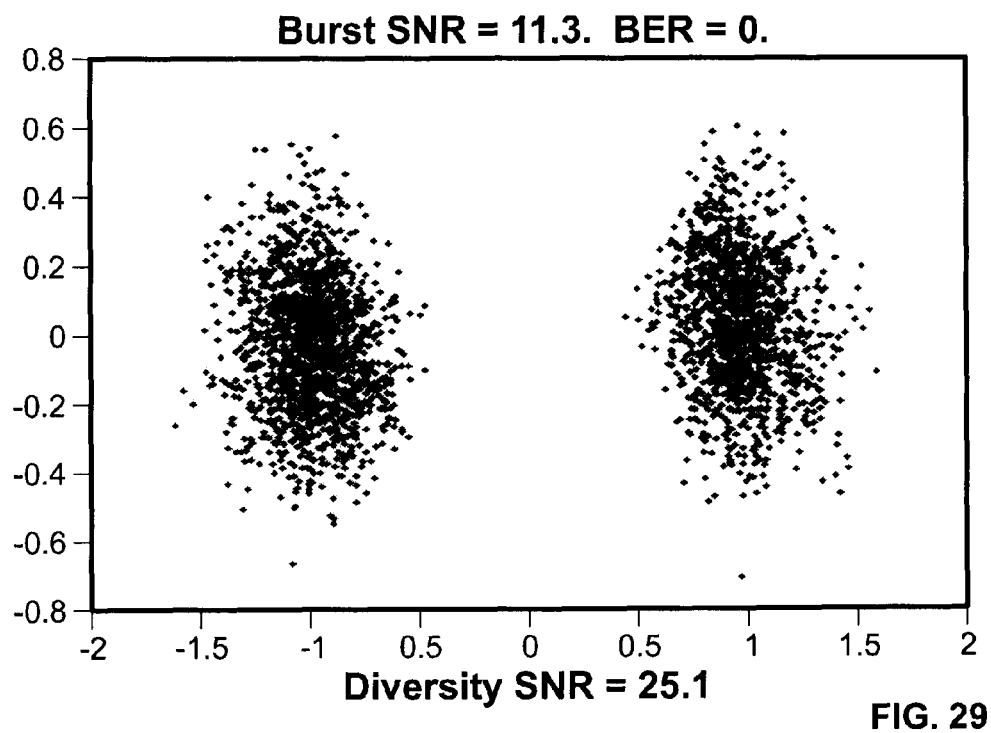
FIG. 29 shows slicer input ideal channel, under RX and TX I/Q imbalance.

The intentional frequency shift specified by MoCA results in the decoupling of the TX and RX imbalance parameters, to show that our algorithm can estimate the RX parameters in the presence of X imbalance we show simulation results for the following scenario TX amplitude imbalance 1[dB]
TX phase imbalance 2°
RX amplitude imbalance 3 [dB]
RX phase imbalance 10°
Frequency Offset 20 ppm
Channel=Ideal, no AWGN Before transmission of Probe2 the SNR was around 11.3 [dB], as shown in FIG. 29.

Figure 30:
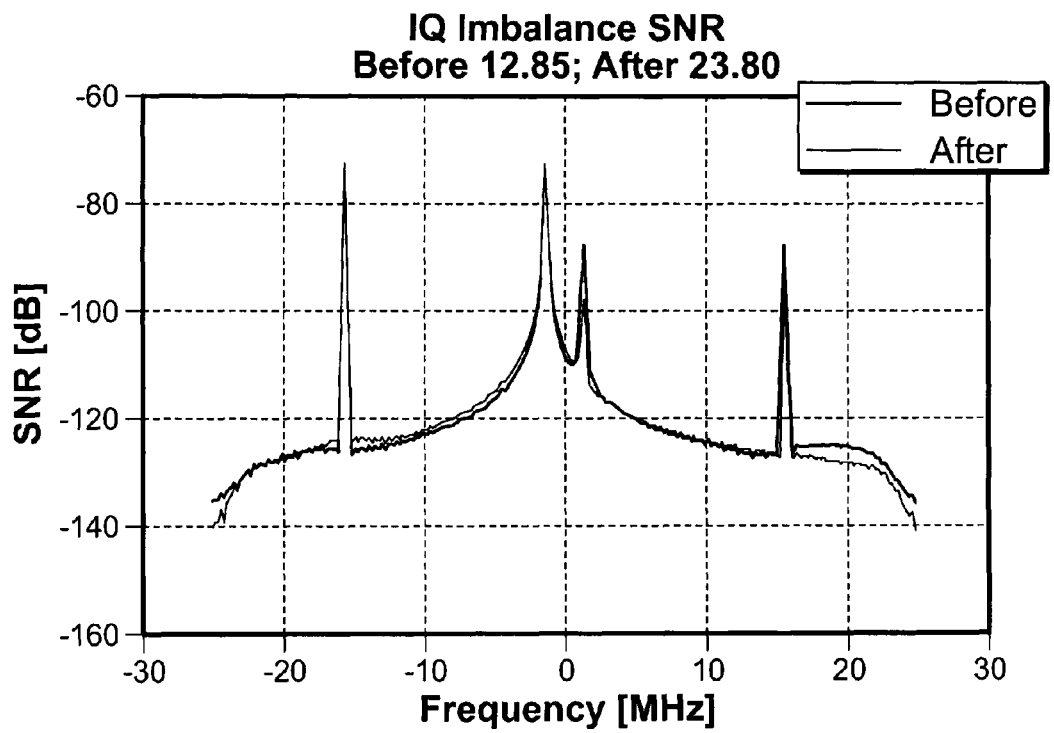
FIG. 30 shows frequency plot ideal channel no AWGN, under RX and TX I/Q imbalance after third iteration.

After three probe2 transmissions the SNR was around 21.2 [dB], as shown in FIG. 30.

Figure 31:
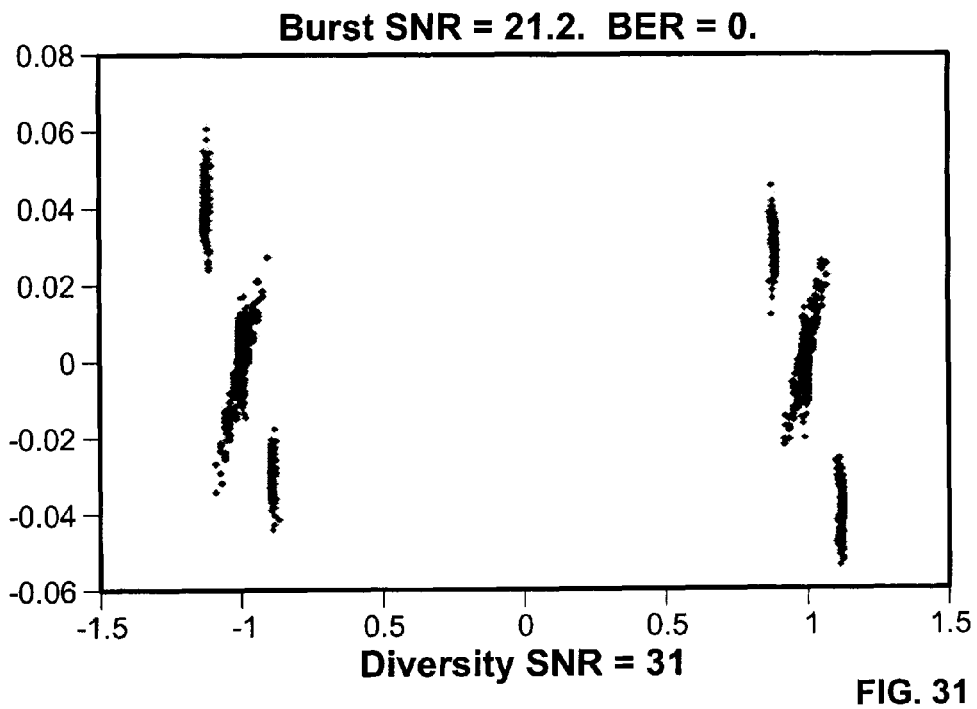
FIG. 31 shows slicer input ideal channel no AWGN, under RX and TX I/Q imbalance after third iteration.

FIG. 31 shows a slicer input Ideal Channel no AWGN, under RX and TX I/Q imbalance after third iteration.

The estimated RX I/Q imbalance parameters after 3 iterations were

| Parameter | True | Estimated |
|---|---|---|
| G | 0.7071 | 0.70785 |
| Θ | 10.0 | 10.2014 |

Thus parameters were correctly estimated, for comparison the SNR in a scenario where only TX imbalance is present is around 21.2[dB].

Figure 15:
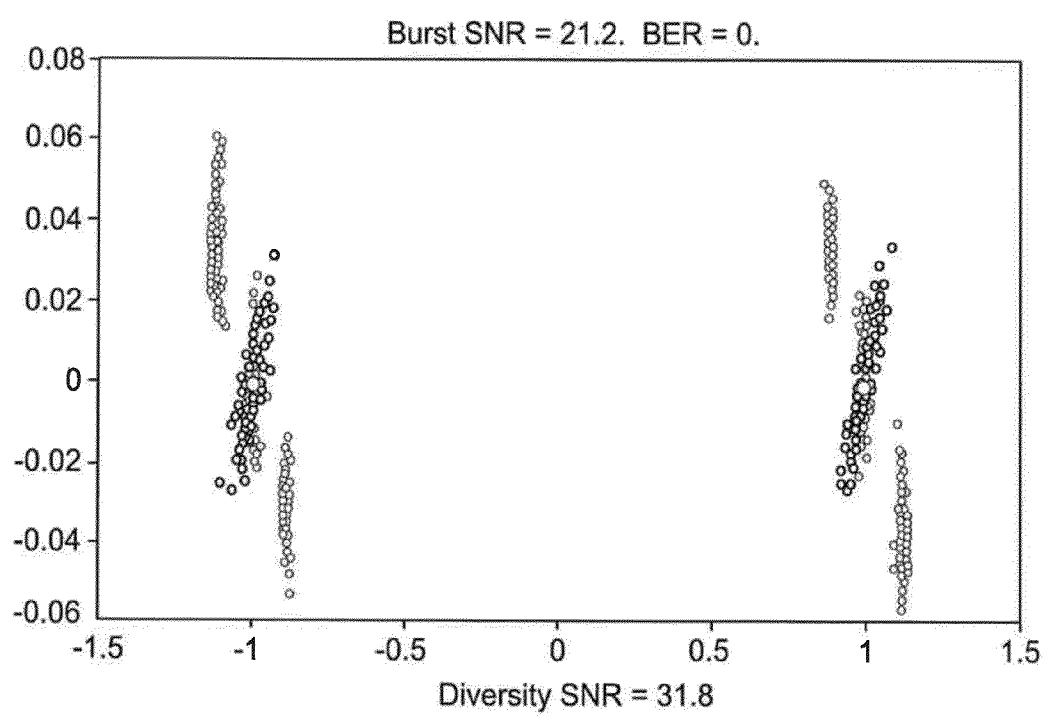
FIG. 15 shows an illustrative plot that summarizes simulation results.

FIG. 15 shows a: Slicer input Ideal Channel no AWGN under TX I/Q imbalance only.

Thus the proposed algorithm is robust in the presence of TX I/Q imbalance.

APPENDIX C

Fixed Point Pseudo Code

The following flow Pseudo code gives a fixed point implementation of the above algorithm. Note that complex variables have the letter "c" prepended.

Function 1: Probe2Processing

```
function [rho, theta, Scale_Q] = Probe2Processing (CFO,
cIQparameters_log,i1,i2, N_delta)
if (CFO==0)
   CFO=-1;
end
% Residual Frequency Estimation
[cphasor_p,cphasor_m] = Residual_Frequency_Estimation
(cIQparameters_log,CFO);
% Residual Frequency Correction
cZ = Residual_frequency_Correction(cIQparameters_log,
cphasor_p,cphasor_m);
% Coefficient Computation
[cfB1 ,cfB2,Scale_ratio] = Coeff_Computation(CFO, i1 ,i2);
% Phasor Estimation
[cg_exp_mTeta_M_16,Scale_g,scale_inv] = Phasor
Estimation (cZ,cfB1,cfB2,CFO,N_delta,Scale_ratio);
% IQ Coeff Computation
[theta,rho, Scale_Q] = Compensation_Params_Estimation
(cg_exp_mTeta_M_16, scale_inv,Scale_g);
```

TABLE C-1

Probe2Processing Variable Definition Table

| Name | Size | Comments | I/O |
|---|---|---|---|
| CFO | 32 bit | Carrier Frequency Offset | I |
| cIQparameters_log | 16 bit × 6 × Nsym Complex | Recorded FFT outputs | I |
| I1 | 8 bit | Negative Bin offset 1 | I |
| I2 | 8 bit | Negative Bin offset 2 | I |
| N_delta | 16 bit | NCO reset time offset | I |
| cphasor_p | 16 bit Complex | Frequency compensation | NA |
| cphasor_m | 16 bit Complex | Frequency compensation | NA |
| cZ | 16 bit × 6 Complex | Rotated FFT output | NA |
| cfB 1 | 16 bit Complex | Estimation Coefficient | NA |
| cfB2 | 16 bit Complex | Estimation Coefficient | NA |
| Scale_ratio | 16 bit | Scaling factor | NA |
| Cg_exp_mTeta_M_16 | 16 bit Complex | Estimated I/Q Phasor | NA |
| Theta | 16 bit | I/Q Compensation | O |
| Rho | 16 bit | I/Q Compensation | O |

Function 2: Residual_Frequency_Estimation

```
function [cphasor_p,cphasor_m] = Residual_Frequency_Estimation
(cIQparameters_log,CFO)
%TBD Select 1 or 2 according to SNR
cfphasor_64 =0;
for i=0:Nsym-2
   cfphasor_64 = Cmplx_Add_64_32(cfphasor_64, Cmplx_Mult_
     16_16(cIQparameters_log(i,1),... conj(cIQparameters_log(i+1,1));
end
%Level control to 16 bit signed
Nphasor_bits = Nfft_out-1;
csphasor =Scale_Complex_64(cfphasor_64, Nphasor_bits);
%Get phasor angle and magnitude
[angle_Ef rPhasor] = cordic_SW( csphasor,1);
%Generate 'Exp_Vec_p'
fScale = 26981;    %const 16 bit - round(gcordic)*2^(Nfft_out-1))
csphasor_div = Cmplx_real_div_32_16 (csphasor<<(Nfft_out-2)),
rPhasor);
   %32bit complex / 16bit real division
% csphasor_div <+-2^15
cphasor_p_32 = (Cmplx_real_mult_16_16(fScale,csphasor_div) )>>
   (Nfft_out-2); %Scale back to 16bit, known
cphasor_p = Cmplx_Saturate(cphasor_p_32, Nphasor_bits);
%Compute angle for IQ image rotation (Coridic Preparations)
angle_m = 2*CFO*(Nfft+ LCP) - angle_Ef; %1rad = 2^(Fr_bits-1)
%Generate 'Exp_Vec_m'
[cphasor_m tmp] = cordic_SW( angle_m,0); %gives -phasor(angle)
```

Function 3: Scale_Complex_64

```
function [csphasor]=Scale_Complex_64(cfphasor_64,
Nphasor_bits)
Ceil_Log 2_Abs_Real_Cfphasor_64=ceil_log 2(abs(real
(cfphasor_64)));
Ceil_Log 2_Abs_Imag_Cfphasor_64=ceil_log 2(abs
(imag(cfphasor_64)));
Scale=Nphasor_bits-max(Ceil_Log 2_Abs_Real_Cfphasor_64, Ceil_Log 2_Abs_Imag_Cfphasor_64);
if (Scale>=0)
csphasor_32=(cfphasor_64<<Scale);
else
csphasor_32=(cfphasor_64>>(-Scale));
end
csphasor=Cmplx_Saturate(csphasor_32, Nphasor_bits);
```

Function 4: ceil_log 2

```
function [i] = ceil_log2 (X)
i=0;
while(X!=0)
   X=X>>1;
   i=i+1;
end
```

Function: 5: Sign

```
function [Y] = Sign (X)
y=1;
if (X<0)
   y=-1;
end
```

Function 6: Cmplx_Saturate

```
function [X_16] = Cmplx_Saturate(X_32,Nbits)
Sign_Real_X_32 = sign(real(X_32));
Sign_Imag_X_32 = sign(imag(X_32));
Abs_Real_X_32 = abs(real(X_32));
Abs_Imag_X_32 = abs(imag(X_32));
if (Abs_Real_X_32 >= (1<<Nbits) )
   if(Sign_Real_X_32==1)
       X_32.r= (1<<Nbits)-1;
   else
   X_32.r=-( (1<< Nbits)-1 );
   end
end
if (Abs_Imag_X_32 >= (1<<Nbits) )
```

```
    if(Sign_Image_X_32==1)
        X_32.i=(1<< Nbits)-1;
    else
        X_32.1=-( (1<< Nbits)-1 );
    end
end
X_16 = X_32; %casting to 16bit
```

TABLE C-2

Residual_Frequency_Estimation, Scale_
Complex_64 Variable Definition Table

| Name | Size | Comments | I/O |
|---|---|---|---|
| cfphasor64 | 64 bit complex | Phasor Acc | NA |
| Nphasor_bits | 8 bit | Target Num of phasor bits | NA |
| csphasor_32 | 32 bit complex | Tmp Variable | NA |
| csphasor | 16 bit complex | Scaled phasor for freq rot | NA |
| rPhasor | 16 bit | Magnitude csphasor | NA |
| csphasor_div | 16 bit complex | Normalized phasor | NA |
| cphasor_p | 16 bit complex | Frequency Compensation | O |
| angle_Ef | 32 bit | Angle of csphasor | NA |
| angle_m | 32 bit | Angle for phasor_m rotation | NA |
| cphasor_m | 16 bit complex | Frequency Compensation | O |

Function 7: Cordic_SW

```
function [z,x] = cordic_SW(data_in ,mode)
%Inits & constants
QUARTER=102944;  %round( pi/2*2^(Fr_bits-1));
Niter=13;        %Do not Change without Zak's permission!
Ntan=16;
x_tmp(0)=0;x_tmp(1)=0;
Atan_Table =[51472,30386,16055,8150,4091,2047,1024,512,
256,128,64,32,16];
if(mode==0)
    %map phase into [-pi/2 pi/2]interval and init Cordic
    [Angle x] = Cordic_Pre_Process(data_in,0);
    %Initial direction of rotation
    if(Angle==0)
        Sgn =1;
    else
        Sgn = -sign(Angle);
    end
else
    %init Cordic
    Angle=0;
    %map phasor into [-pi/2 pi/2]interval and init Cordic
    [data in Angle_Offset] = Cordic_Pre_Process(data_in,1);
    x(0) = real(data_in);
    x(1) = imag(data_in);
    if(x(1) ==0)
        Sgn = 1;
    else
        Sgn = sign(x(1));
    end
end
```

TABLE C-3

SW CORDIC variable definition

| Name | Size | Comments | I/O |
|---|---|---|---|
| x_tmp | 32 bit × 2 array | Local memory (no more than 17 bits used) | NA |
| Atan_Table | 16 bit × 13 array | ATan Table (const) | NA |
| data_in | 32 bit complex | CORDIC input | I |
| Angle | 32 bit | Phasor Angle | NA |
| Angle_offset | 32 bit | Phasor Angle offset | NA |
| X | 32 bit × 2 array | CORDIC out 1 | O |
| z | 32 bit × 2 array | CORDIC out 2 | O |
| mode | Boolean (1 bit) | CORDIC mode select | I |

Function 8: Cordic_Pre_Process

```
function [data_in, X] = Cordic_Pre_Process(data_in,mode)
%*********************************************************
% Pre Cordic Processing Bring angle to [-pi/2,pi/2] and find Quadrate
%*********************************************************
if(mode==0)
    Npi = 0;
    Sgn=0;
    while (data_in < -QUARTER)
        data_in = data_in + (QUARTER<<1);
        Npi = 1-Npi;
    end
    while (data_in > QUARTER)
        data_in =data_in - (QUARTER<<1);
        Npi=1-Npi;
    end
    X(0) =19898;          % (1/GainCordic)*2^(Ntan-1)
    X(1) = 0;
    if(Npi)
        X=-X;
    end
else
    X=0;
    Sgn_real = sign(real(data_in));
    Sgn_imag = sign(imag(data_in));
    if ( Sgn_real ==-1 )
        data_in = -data_in;
        if(Sgn_imag == 1)
            X = QUARTER<<1;
        else
            X = -(QUARTER<< 1);
```

```
        end
    end
end
```

TABLE C-4

Cordic_SW, Cordic_Pre_Process variable definition

| Name | Size | Comments | I/O |
|---|---|---|---|
| data_in | 32 bit complex | CORDIC input | I/O |
| X | 16 bit × 2 array | CORDIC Phasor | O |

Function 9: Residual_frequency_Compensation

```
function [cZ_16] = Residual_frequency_Correction(cIQparameters_log,cphasor_p,cphasor_m)
cdphasor_p = cphasor_p;
cdphasor_m = cphasor_m;
cZ_ACC_64 = zeros(1,6);%64bit Acc array (16bit phasor * 16bit FFT output + log2(40)bit for acc >32 !!!!)
for i=1:Nsym-1
    cZ_ACC_64(1) = Cmplx_Add_64_32(cZ_ACC_64(1), Cmplx_Mult_16_16(cIQparameters_log(i+1,1)
        ,cphasor_p);
    cZ_ACC_64(2) = Cmplx_Add_64_32(cZ_ACC_64(2), Cmplx_Mult_16_16(cIQparameters_log(i+1,2)
        ,cphasor_p);
    cZ_ACC_64(3) = Cmplx_Add_64_32(cZ_ACC_64(3), Cmplx_Mult_16_16(cIQparameters_log(i+1,3)
        ,cphasor_m);
    cZ_ACC_64(4) = Cmplx_Add_64_32(cZ_ACC_64(4), Cmplx_Mult_16_16(cIQparameters_log(i+1,4)
        ,cphasor_m);
    cZ_ACC_64(5) = Cmplx_Add_64_32(cZ_ACC_64(5), Cmplx_Mult_16_16(cIQparameters_log(i+1,5)
        ,cphasor_m);
    cZ_ACC_64(6) = Cmplx_Add_64_32(cZ_ACC_64(6), Cmplx_Mult_16_16(cIQparameters_log(i+1,6)
        ,cphasor_m);
    cphasor_p = Cmplx_Saturate((Cmplx_Mult_16_16 (cphasor_p,cdphasor_p))>>(Ntan-1), Ntan-1);
    cphasor_m = Cmplx_Saturate( (Cmplx_Mult_16_16 (cphasor_m,cdphasor_m))>>(Ntan-1), Ntan-1);
end
%Scale Back to fit 32bit
for i=1:6
cZ_ACC_32(i) = cZ_ACC_64(i)>>(Nfft_out);
end
% Level control vector so that max fits in 16bit
Max_Z=0;
for i=1:6
    if (abs(real(cZ_ACC_32(i)))>Max_Z)
        Max_Z = abs(real(Z_ACC_32(i)));
    end
    if (abs(imag(cZ_ACC_32(i)))>Max_Z)
        Max_Z = abs(imag(Z_ACC_32(i)));
    end
end
%Scale Back to 16 bits
Scale_Z = (Nfft_out-1) – ceil_log2(Max_Z);
for i=1:6
cZ_16(i) = Cmplx_Saturate (cZ_ACC_32(i)>>(Scale_Z), Nfft_out- 1);
end
```

TABLE C-5

Residual_frequency_Compensation variable

| Name | Size | Comments | I/O |
|---|---|---|---|
| cdphasor_p | 16 bit Complex | | NA |
| cdphasor_m | 16 bit Complex | | NA |
| cphasor_p | 16 bit Complex | | I |
| cphasor_m | 16 bit Complex | | I |
| cZ_ACC_64 | 64 bit Complex × 6 array | | NA |
| cZ_32 | 32 bit Complex × 6 array | | NA |
| cZ_16 | 16 bit Complex × 6 array | | O |
| Max_32 | 32 bit | | NA |
| ScaleZ | 16 bit | | NA |

Function: 10: Coeff Computation

```
function [cfB1,cfB2,Scale_ratio] = Coeff_Computation(CFO,i1,i2)
Log2Nfft = 8;           %log2(Nfft) = log2(256)=8;
PI_over_FFT = 804;      % round(pi/Nfft*2^(Fr_bits-1))
Nfft=256;
N1=2;
```

-continued

```
[cphasor11 tmp] = cordic_SW( (CFO<<(1+Log2Nfft)),0);
cphasor11 = Switch_real_imag(cphasor11);
cfs11 = Cmplx_Add_16_16 (phasor11, -sqrt(-1)*(1<<(Ntan-1)));
fs21 = CFO+PI_over_FFT *i1;
fs22 = CFO +PI_over_FFT *i2;
if(fs21==0)
    cfB1_32 = 1<<( Nfft_out+ Log2Nfft );
else
    cfB1_32 = Cmplx_real_div_32_16 ((cfs11<<(Nfft_out-N1)),fs21);
end
if(fs22==0)
    cfB2_32 = 1<<( Nfft_out+ Log2Nfft );
else
    cfB2_32 = Cmplx_real_div_32_16 ((cfs11<<(Nfft_out-N1)),fs22);
```

-continued

```
end
%Scale to fB1,fB2 to 15bit signed
Max =0;
Max_abs_real_cfB1 = abs(real(cfB1_32));
Max_abs_imag_cfB1= abs(imag(cfB1_32));
Max_abs_real_cfB2 = abs(real(cfB2_32));
Max_abs_imag_cfB2= abs(imag(cfB2_32));
if(Max_abs_real_cfB1 >Max)
    Max = Max_abs_real_cfB1;
end
if(abs Max_abs_imag_cfB1>Max)
    Max = Max_abs_imag_cfB1;
end
if(Max_abs_real_cfB2 >Max)
    Max = Max_abs_real_cfB2
end
if(Max_abs_imag_cfB2>Max)
    Max Max_abs_imag_cfB2;
end
    Scale_ratio = 15-(ceil_log2(Max)+1);
If (Scale>=0)
    cfB1 = Cmplx_Saturate( (cfB1_32<<Scale_ratio), Nfft_out-2);
    cfB2 = Cmplx_Saturate ((cfB2_32<<Scale_ratio),Nfft_out-2);
else
    cfB1 = Cmplx_Saturate ((cfB1_32>>-Scale_ratio), Nfft_out-2);
    cfB2 = Cmplx_Saturate ((cfB2_32>>-Scale_ratio), Nfft_out-2);
end
```

TABLE C-6

Coeff Computation Variable Definition

| Name | Size | Comments | I/O |
|---|---|---|---|
| cphasor11 | 16 bit complex | CORDIC out | NA |
| cfs11 | 32 bit complex | Coeff Numerator | NA |
| fs21 | 16 bit | Coeff Denominator | NA |
| fs22 | 16 bit | Coeff Denominator | NA |
| cfB1_32 | 32 bit complex | Unsealed Coeff 1 | NA |
| cfB2_32 | 32 bit complex | Unsealed Coeff 2 | NA |
| cfB1 | 16 bit complex | Coeff 1 | O |
| cfB2 | 16 bit complex | Coeff 2 | O |
| Scale_ratio | 16 bit | Coeff Scale factor | O |

Function 11: Phasor Estimation Variable Definition

```
function [cg_exp_mTeta_M_16,Scale_g,scale_inv] =
    Phasor_Estimation(cZ,cfB1,cfB2,CFO,N_delta,Scale_ratio)
N2=2;
%*********************************************************************
%   Fix Point Computation of
%
%   Z1*( |fB1|^2+|fB2|^2)            Z1*( |fB1|^2+|fB2|^2)*(B1'*Z3 +B2*Z4')'
%   ------------------------------ = ----------------------------------------
%   B1'*Z3 +B2*Z4'                   |B1'*Z3|^2 +|B2*Z4'|^2
%*********************************************************************
sumfB1SfB2S = (Real_Add_30_30_T(MAG_2_16(cfB1), MAG_2_16(cfB2)))>>15
cNUMERATOR_32(0) = Cmplx_Real_Mul_16_16(cZ(0),sumfB1SfB2S);
cNUMERATOR_32(1) = Cmplx_Real_Mul_16_16(cZ(1),sumfB1SfB2S);
cDENOM_32(0) =Cmplx_Add_32_32(Cmplx_Mul_16_16(conj(cZ(2)),(cfB1)),
        Cmplx_Mul_16_16(conj(cZ(3)),(cfB2)));
cDENOM_32(1) = Cmplx_Add_32_32(Cmplx_Mul_16_16(conj(cZ(4)),(cfB1)),
        Cmplx_Mul_16_16(conj(cZ(5)),(cfB2)));
cMul_NUM_cDENOM_64(0) = Cmplx_Mul_32_32(cNUMERATOR_32(0),conj(cDENOM_32(0)));
cMul_NUM_cDENOM_64(1) = Cmplx_Mul_32_32(cNUMERATOR_32(1),conj(cDENOM_32(1)));
DENOM_2_64(0) = MAG_2_32(cDENOM_32(0));
DENOM_2_64(1) = MAG_2_32(cDENOM_32(1));
%Level Control for division scale denominator down to 32bit
if(DENOM_2_64(0)>DENOM_2_64(1) )
    Scale = ceil_log2(DENOM_2_64(0)));
else
    Scale = ceil_log2(DENOM_2_64(1)));
end
Scale = 31-Scale;
If(Scale>=0)
DENOM_2_32(0) = Cmplx_Saturate (DENOM_2_64(0)<<(Scale),31);
DENOM_2_32(1) = Cmplx_Saturate (DENOM_2_64(I)<< (Scale),31);
else
DENOM_2_32(0) = Cmplx_Saturate( DENOM_2_64(0)>>(-Scale),31);
DENOM_2_32(1) = Cmplx_Saturate (DENOM_2_64(1)>>(-Scale),31);
end
%complex/real division 64bit/32bit gives 32bit result
cfCM(0) = Cmplx_real_div_64_32 (cMul_NUM_cDENOM_64(0)>>N2 ,DENOM_2_32(0));
cfCM(1) = Cmplx_real_div_64_32 (cMul_NUM_cDENOM_64(1)>>N2 ,DENOM_2_32(1));
cfCM_avg = Cmplx_Add_32_32 (cfCM(0),cfCM(1));
% Rotation of FCM _avg needed only if HW can not Insure Delatn=0
[cphasor_dn tmp] = cordic_SW( (CF0<<1)*N_delta, 0);
cfCM_avg_rot_64 = Cmplx_Mul_32_16(cfCM_avg,cphasor_dn);
cfCM_avg_rot_32 = fCM_avg_rot_64>>(Ntan);
Scale_fCM = Ntan-1-N1+Scale_ratio-Scale-6-N2;
fCM_one_level_32 = 1<<(Scale_fCM);
cfp_m_32 = Cmplx_Real_Add_32_32( cfCM_avg_rot_32, -fCM_one_level_32);
cfp_p_32 = Cmplx_Real_Add_32_32( cfCM_avg_rot_32, fCM_one_level_32);
cNUMERATORf_64 = Cmplx_Mul_32_32(cfp_m_32,conj(cfp_p_32));
DENOMf_64 = MAG_2_32 (cfp_p_32);
%Level Control for division scale denominator down to 32bit signed
Abs_real_Numerator64 = abs(real(cNUMERATORf_64));
```

-continued

```
Abs_imag_Numerator64 = abs(imag(cNUMERATORf_64));
if(Abs_real_Numerator64) > Abs_imag_Numerator64)
    Scale_fn =30 – ceil_log2(Abs_real_Numerator64);
else
    Scale_fn =30 – ceil_log2(Abs_imag_Numerator64);
end
if(Scale_fn>=0)
cNUMERATORf_32= cNUMERATORf_64<<(Scale_fn);
else
cNUMERATORf_32= cNUMERATORf_64>>(-Scale_fn);
end
%Level Control for division scale denominator down to 16bit unsigned
Scale_fd =16 – ceil_log2(DENOMf_64);
if(Scale_fd >=0)
DENOMf_scaled_16= Cmplx_Saturate (DENOMf_64<<(Scale_fd),16);
else
DENOMf_scaled_16= Cmplx_Saturate (DENOMf_64>>(-Scale_fd),16);
end
% Division 32bit complex by 16bit real
cg_exp_mTeta_M_16 = Cmplx_real_div_32_16 (cNUMERATORf_32,DENOMf_scaled_16);
Scale_g = Scale_fd-Scale_fn;
scale_inv = 14-Scale_fd+Scale_fn;
```

TABLE C-7

Phasor Estimation Variable Definition

| Name | Size | Comments | I/O |
|---|---|---|---|
| sumfB1SfB2S | 16 bit | | |
| cNUMERATOR_32 | 32 bit × 2 complex array | | |
| cDENOM_32 | 32 bit × 2 complex array | | |
| cMul_NUM_cDENOM_64 | 64 bit × 2 complex array | | |
| DENOM_2_64 | 64 bit × 2 array | | |
| DENOM_2_32 | 32 bit × 2 array | | |
| cfCM | 32 bit × 2 complex array | | |
| cfCM_avg | 32 bit complex | | |
| cphasor_dn | 32 bit complex | | |
| cfs11 | 16 bit complex | | |
| fs21 | 16 bit | | |
| fs22 | 16 bit | | |
| cfCM_avg_rot_64 | 64 bit complex | | |
| cfCM_avg_rot_32 | 32 bit complex | | |
| cfCM_one_level_32 | 32 bit | | |
| cfp_m_32 | 32 bit complex | | |

TABLE C-7-continued

Phasor Estimation Variable Definition

| Name | Size | Comments | I/O |
|---|---|---|---|
| cfp_p_32 | 32 bit complex | | |
| cNUMERATORf_64 | 64 bit complex | | |
| DENOMf_64 | 64 bit | | |
| Abs_real_Numerator64 | 64 bit | | |
| Abs_imag_Numerator64 | 64 bit | | |
| cNUMERATORf_32 | 32 bit complex | | |
| DENOMf_scaled_16 | 16 bit complex | | |
| cg_exp_mTeta_M_16 | 16 bit complex | | O |
| Scale_g | 16 bit | | O |
| scale_inv | 16 bit | | O |
| Scale_fd | 16 bit | | |
| Scale_fn | 16 bit | | |
| Scale_fCM | 16 bit | | |
| Scale | 16 bit | | |

Function 12: Compensation_Params_Estimation

```
function [theta,rho, Scale_Q] = Compensation_Params_Estimation(cg_exp_mTeta_M_16,
        scale_inv,Scale_g)
Mue_bits=4;
if(ProbeII_Num == 1)
Mue =12;
elseif(ProbeII_Num == 2)
Mue = 8;
else
Mue = 4;
End
if(ProbeII_Num>=1)
   % First Order Loop
   Mue_1m = (16-Mue);
   cg_ACC_32 = cg_exp_mteta <<(-Scale_g-Mue_bits);
   cg_Delta_32 = (Cmplx_Mul_16_16 (cg_exp_mteta *cg_exp_mTeta_M_16))>>4;
   cg_ACC_32 = Cmplx_Add_32_32 (Cmplx_Mul_32_16(cg_ACC_32,Mue_Fix_1m),
           Cmplx_Mul_32_16(cg_Delta_32,Mue_Fix ))>>(-Scale_g);
   cg_exp_mteta = g_ACC_32;
   %   I/Q Correction Params Calculation
   [theta,rho, Scale_Q] = Compute_Fix_Point_IQ_Coeffs(cg_exp_mteta,scale_inv,Scale_g,0);
else
    g_exp_mteta = cg_exp_mTeta_M_16;
    %   I/Q Correction Params Calculation
   [theta,rho, Scale_Q] = Compute_Fix_Point_IQ_Coeffs(g_exp_mTeta_M_16,scale_inv, Scale_g,1);
end
ProbeII_Num = ProbeII_Num+1;
```

TABLE C-8

Compensation_Params_Estimation variable definition

| Name | Size | Comments | I/O |
|---|---|---|---|
| ProbeII_Num | 16 bit | Reset Value is 0 | NA |
| Mue | 16 bit | Loop Gain | NA |
| Mue_1m | 16 bit | Complementary Loop Gain | NA |
| cg_ACC_32 | 32 bit complex | | |
| cg_Delta_32 | 32 bit complex | | |
| cg_exp_mteta | 16 bit complex | | |
| theta | 16 bit | Reset Value 2048 | O |
| rho | 16 bit | Reset Value 0 | O |
| Scale_Q | 1 bit | Reset Value 1 | O |

TABLE C-9

Compute_Fix_Point_IQ_Coeffs variable definition

| Name | Size | Comments | I/O |
|---|---|---|---|
| scale_inv_log | 16 bit | | |
| scale_delta_log | 16 bit | | |
| scale_inv | 16 bit | | |
| scale_delta | 16 bit | | |
| real_g_exp_mTeta_M_16 | 16 bit | | |
| imag_g_exp_mTeta_M_16 | 16 bit | | |
| Inv_real_g_exp_mTeta_M_16 | 16 bit | | |
| Scale_theta | 16 bit | | |
| Scale_rho | 16 bit | | |
| Rho_32 | 32 bit | | |
| theta | 16 bit | | O |

Function 13: Compute_Fix_Point_IQ_Coeffs

```
function [theta,rho, Scale_Q] = Compute_Fix_Point_IQ_Coeffs(cg_exp_mTeta_M_16,scale_inv, scale_g
    ,FirstTime)
if(FirstTime)
    scale_delta=0;
    if (scale_inv>31)
        scale_delta = scale_inv-31;
        scale_inv=31;
    end
    scale_inv_log = scale_inv;
    scale_delta_log = scale_delta;
    scale_g_log = scale_g;
else
    scale_inv = scale_inv_log;
    scale_delta= scale_delta_log;
    scale_g = scale_g_log;
end
real_g_exp_mTeta_M_16 = real(cg_exp_mTeta_M_16);
imag_g_exp_mTeta_M_16 = imag(cg_exp_mTeta_M_16);
if( real_g_exp_mTeta_M_16 > 1<< (-scale_g_log) )
    Inv_real_g_exp_mTeta_M_16 = Cmplx_real_div_32_16 (1 <<(scale_inv),real_g_exp_mTeta_M_16));
    Scale_theta = -14+Teta_bits-1+scale_delta;
    If(Scale_theta>=0)
theta = Inv_real_g_exp_mTeta_M_ 16<<(Scale_theta);
    else
theta = Inv_real_g_exp_mTeta_M_16>>(-Scale_theta);
    end
    Rho_32 = Cmplx_Mul_ 16_16 (-imag_g_exp_mTeta_M_16,Inv_real_g_exp_mTeta_M_16);
    Scale_rho = -Rho_bits+1+scale_inv;
    If(Scale_rho>=0)
rho = Rho_32<<(Scale_rho);
    else
rho = Rho_32>>(-Scale_rho);
    end
    Scale_Q = 1;
else
    Scale_theta = scale_g_log +Teta_bits-1;
    Scale_ rho = scale_g_log + Rho_bits –1;
    If(Scale_theta>=0)
theta = real_g_exp_mTeta_M_16<<(Scale_theta);
    else
theta = real_g_exp_mTeta_M_16>>(-Scale_theta);
    end
    If(Scale_rho>=0)
rho = (-imag_g_exp_mTeta_M_16)<<(Scale_rho);
    else
rho = (-imag_g_exp_mTeta_M_16)>>(-Scale_rho);
    end
    Scale_Q = 0;
end
```

TABLE C-9-continued

Compute_Fix_Point_IQ_Coeffs variable definition

| Name | Size | Comments | I/O |
|---|---|---|---|
| rho | 16 bit | | O |
| Scale_Q | 1 bit | | O |

Complex Math Operation Definitions
[C_32_r,C_32_i]=Cmplx_Add_16_16(A_16_r,A_16_i, B_16_r,B_16_i);
   C_32_r=A_16_r+B_16_r
   C_32_i=A_16_i+B_16_i
[C_32_r,C_32_i]=Cmplx_Add_32_32(A_32_r,A_32_i,B_32_r,B_32_i);
   C_32_r=A_32_r+B_32_r
   C_32_i=A_32_i+B_32_i
[R_32]=Real_Add_30_30_T(A_30,B_30);
   R_32=A_30+B_30
[C_64_r,C_64_i]=Cmplx_Add_64_32(A_64_r,A_64_i,B_32_r,B_32_i);
   C_64_r=A_64_r+B_32_r
   C_64_i=A_64_i+B_32_i
[C_32_r,C_32_i]=Cmplx_Real_Add_32_16 (A_32_r, A_32_i,B_16);
   C_32_r=A_32_r+B_16
   C_32_i=A_32_i
[C_32_r,C_32_i]=Cmplx_imag_Add_32_16 (A_32_r, A_32_i,B_16);
   C_32_r=A_32_r
   C_32_i=A_32_i+B_16
[C_32_r]=MAG_2_16(A_16_r,A_16_i)
   C_32_r=A_16_r*A_16_r+A_16_i*A_16_i
[C_64_r]=MAG_2_32(A_32_r,A_32_i)
   C_64_r=A_32_r*A_32_r+A_32_1*A_32_i
[C_32_r,C_32_i]=Cmplx_Mult_16_16(A_16_r,A_16_i,B_16_r,B_16_i)
   C_32_r=A_16_r*B_16_r−A_16_i*B_16_i
   C_32_i=A_16_r*B_16_i+A_16_i*B_16_r
[C_64_r,C_64_i]=Cmplx_Mult_32_32(A_32_r,A_32_i,B_32_r,B_32_i)
   C_64_r=A_32_r*B_32_r−A_32_i*B_32_i
   C_64_i=A_32_r*B_32_i+A_32_i*B_32_r
[C_32_r,C_32_i]=Cmplx_real_Mult_16_16(A_16_r, A_16_i,B_16_r)
   C_32_r=A_16_r*B_16_r
   C_32_i=A_16_i*B_16_r
[C_64_r,C_64_i]=Cmplx_Mul_32_16(A_32_r,A_32_i,B_16_r)
   C_64_r=A_32_r*B_16_r
   C_64_i=A_32_i*B_16_r
[C_16_r,C_16_i]=Cmplx_real_div_32_16(A_32_r, A_32_i,B_16_r)
   C_32_r=A_32_r/B_16_r
   C_32_i=A_32_i/B_16_r
[C_32_r,C_32_i]=Cmplx_real_div_64_32(A_64_r, A_64_i,B_32_r)
   C_32_r=A_64_r/B_32_r
   C_32_i=A_64_i/B_32_r
[C_16_r,C_16_i]=Switch_real_imag(A_16_r,A_16_i);
   C_32_r=A_16_i
   C_32_i=A_16_r

APPENDIX D

Exemplary Parameters of a HW-SW Interface

The following table summarizes the information exchanged between the HW and SW during probe2 reception. Output refers to Output from the HW and Input refers to Input to the HW.

| HW Name | SW Name | Size | Input to/Output from HW | Remarks |
|---|---|---|---|---|
| Δn | N_delta | 16 bits | Output | Number of samples between NCO reset and first sample of the FFT window. |
| i1 | I1 | 3 bit | Output | Offset index of first negative FFT bin from nominal |
| i2 | I2 | 4 bit | Output | Offset index of second negative FFT bin from nominal |
| CFO | CFO | 17 bit | Output | Carrier Frequency Offset (after fine frequency offset) |
| Z[k1,:] | cIQparameters_log(0,:) | 16×2×Nprobe2_symbols bit | Output | FFT output at bin k1 for symbols 1,..., Nprobe2_symbols |
| Z[k2,:] | cIQparameters_log(1,:) | 16×2×Nprobe2_symbols bit | Output | FFT output at bin k2 for symbols 1,..., Nprobe2_symbols |
| Z[−k1+i1,:] | cIQparameters_log(2,:) | 16×2×Nprobe2_symbols bit | Output | FFT output at bin −k1+i1 for symbols 1,..., Nprobe2_symbols |
| Z[−k1+i2,:] | cIQparameters_log(3,:) | 16×2×Nprobe2_symbols bit | Output | FFT output at bin −k1+i2 for symbols 1,..., Nprobe2_symbols |
| Z[−k2+i1,:] | cIQparameters_log(4,:) | 16×2×Nprobe2_symbols bit | Output | FFT output at bin −k2+i1 for symbols 1,..., Nprobe2_symbols |
| Z[−k2+i2,:] | cIQparameters_log(5,:) | 16×2×Nprobe2_symbols bit | Output | FFT output at bin −k2+i2 for symbols 1,..., Nprobe2_symbols |
| ζ | theta | 12 bit unsigned | Input | I/Q Compensation parameter |
| ρ | Rho | 12 bit | Input | I/Q Compensation parameter |
| Scale_Q | Scale_Q | 1 bit | Input | I/Q Compensation parameter |

APPENDIX E

Frequency Offset Introduction, CP Length, Number of Symbols

```
function [dF] = Frequency_Offset_Introduction(CFO)
Freq_Th = 41;          %round((5e3/50e6)*2*pi*2^16)
if (abs(CFO)< Freq_Th)
    dF = sign(CFO)*(TBD RF Interface introduce);
else
    dF=0;
end
```

Tone Selection

```
function [SC] = ProbeII_Tone_Selection(Sigma_2_32)
SC_MIN(0) = 146;
SC_MAX(0) = 186;
SC_MIN(2) = 217;
SC_MAX(2) = 249;
SC_DEFAULT(0) = 176;
SC_DEFAULT(1) = 249;
NLog_In_Bits=6;
NLog_Out_ Bits=14;
SC = SC_DEFAULT;
a=-7871; % round(-1.921625277102556*2^(NLog_Out_Bits-2) ) ;
b= 8071; % round( 1.970377382221271*2^(NLog_Out_Bits-2) );
C =32656; %round(0.0375*log2(10)*2^(NLog_Out_Bits-2 + NLog_In_Bits));
%Find Default NSR log2(Sigma_2)
for i=0:1
    Scale_16(i) = ceil_log2( Sigma_2_32(SC_DEFAULT(i)) );
    Frac_16(i) = Sigma_2_32(SC_DEFAULT(i))>> (Scale_16(i) -NLog_In_Bits );
    NSR_Default_32(i) = Scale_16(i) << (NLog_Out_Bits - 2 + NLog_In_Bits)+ ...
        (Real_Mult_16_16(b,Frac_16(i))+a<<(NLog_In_Bits) );
    NSR_Best_32(i) = NSR_Default_32(i);
    for k=[SC_MIN(i) : SC_MAX(i)]
        Scale_k_16 = ceil_log2( Sigma_2_32 (k) );
        Frac_k_16 = Sigma_2_32 (k)>>(Scale_k_16 -NLog_In_Bits );
        NSR_32 = Scale_k_16 << (NLog_Out_Bits-2 + NLog_In_Bits)+ ...
            (Real_Mult_16_16(b,Frac_k_16)+a<<(NLog_In_Bits) );
        if(NSR_32< Add_Real_32_32(NSR_Default_32 (i),...
            - Real_Mult_16_16(C, Abs_ 16(Add_Real_16_16(k, -SC_DEFAULT(i))) )
            if(NSR_32 < NSR_Best_32(i))
                SC(i) = k;
                NSR_Best_32(i) = NSR_32;
            end
        end
    end
end
```
Where Sigma_32 is a vector of the estimated noise variance of the various FFT tones.

CP & Number of OFDM Symbol Selection

```
function [NUM_OF_SYMS, CP_LENGTH] = Probe2_CP_L_Select(CFO)
CP_Max = 126;
CP_Min = 64;
L_Max = 40;
L_Min = 28;
PI = 205887;          %round(pi*2^Freq_bits-1)
2P = 411775;          %round(2pi*2^Freq_bits-1)
Phase_Th = 41177;     %round(2pi/10*2^Freq_bits-1)
dPhase_64= 0;
error= 0;
Min_Err = Inf;
NUM_OF_SYMS = L_Min;
CP_LENGTH =CP_Min;
for CP = CP_Min: CP_Max
    for L= L_Min: L_Max
        dPhase_32 = L*(CP+Nfft)*(CFO);
        while (abs(dPhase_32) > 2P)
            dPhase_32= dPhase_32- sign(dPhase_32)* 2P;
        end
        if (abs(dPhase_32 )>PI)
            error_32 = abs(2PI - abs(dPhase_32));
        else
            error_32 = abs(dPhase_32);
        end
        if( error_32 < Phase_Th )
            Indicator=1;
            if(error_32 <Min_Err)
                Min_Err = error;
                NUM_OF_SYMS = L;
                CP_LENGTH =CP;
            end
        end
    end
end
```

What is claimed is:

1. A method for compensating for an imbalance between a first component of a data signal and a second component of the data signal, the data signal having a positive-valued frequency and being modulated by a carrier signal having a frequency error, the method comprising:
   receiving the data and carrier signals;
   selecting a value for a time domain parameter such that a frequency domain energy corresponding to a negative-valued frequency is minimized;
   modifying in the time domain at least one of the components based on the value, estimating a carrier signal frequency corresponding to the carrier signal;

estimating a residual carrier frequency error; and modifying an estimate of the carrier frequency based on the residual carrier frequency error;

wherein the modifying in the time domain comprises:
identifying a first value corresponding to a signal amplitude multiplier for the component; and
identifying a second value corresponding to a phase shift for the component.

2. The method of claim 1 wherein the selecting includes recording a first frequency domain parameter and a second frequency domain parameter for each of a first tone, a second tone and the carrier signal.

3. The method of claim 2 wherein:
for at least one of the first tone, the second tone and the carrier signal, the first and second frequency domain parameters correspond, respectively to first and second bins in a discrete-valued frequency spectrum; and
the first bin is sequentially adjacent the second bin.

4. The method of claim 2 further comprising transmitting an output signal that depends on the first and second frequency domain parameters.

5. The method of claim 2 wherein:
the receiving comprises receiving an orthogonal frequency division multiplexing (OFDM) symbol; and
in the selecting the value corresponds to the OFDM symbol; and
the modifying is performed with respect to the OFDM symbol.

6. The method of claim 2 wherein:
the receiving comprises receiving a plurality of orthogonal frequency division multiplexing (OFDM) symbols;
the selecting is performed for each of the OFDM symbols; and
the modifying is performed for each of the OFDM symbols.

7. The method of claim 2 wherein:
one of the first and second components is an in-phase signal;
the other of the first and second components is a quadrature signal; and
the imbalance is an in-phase/quadrature imbalance.

8. A system operative to record complex parameters corresponding to frequency components of a received signal, the signal carrying at least one orthogonal frequency division multiplexing (OFDM) symbol, the parameters corresponding to:
a carrier frequency having a frequency error;
a first tone; and
a second tone,
the system configured to estimate a frequency bin corresponding to each of the carrier frequency, the first tone and the second tone;
wherein there are first and second complex parameters corresponding to each of the carrier frequency, the first tone and the second tone, the system is further operative to:

estimate a second frequency bin corresponding to each of the carrier frequency, the first tone and the second tone; and record the first and second complex parameters for each of the carrier frequency, the first tone and the second tone;

the system further operative to record both of the complex parameters for each of the carrier frequency, the first tone and the second tone based upon an estimated value for each of the carrier frequency, the first tone and the second tone;

wherein all of the estimated values correspond to a single OFDM symbol.

9. The system of claim 8 wherein, when the received signal carries a plurality of OFDM symbols, further operative to estimate values of each of the carrier frequency, the first tone and the second tone for each of the OFDM symbols.

10. A method using one or more non-transitory computer-readable media storing computer-executable instructions which, when executed by a processor on a computer system, instruct the method to record complex parameters during a MoCA Probe2 burst reception, the parameters corresponding to frequency components of a received signal, the signal carrying at least one orthogonal frequency division multiplexing (OFDM) symbol, the parameters corresponding to:

a carrier frequency having a frequency error;

a first tone; and a second tone;

the method further operative to estimate values of each of the carrier frequency, the first tone and the second tone for each of the OFDM symbols when the received signal during the MoCA Probe2 burst reception carries a plurality of OFDM symbols;

wherein there are first and second complex parameters corresponding to each of the carrier frequency, the first tone and the second tone, the method is further operative to:

estimate a second frequency bin corresponding to each of the carrier frequency, the first tone and the second tone; and record the first and second complex parameters for each of the carrier frequency, the first tone and the second tone;

method further operative to record both of the complex parameters for each of the carrier frequency, the first tone and the second tone based upon an estimated value for each of the carrier frequency, the first tone and the second tone;

wherein all of the estimated values correspond to a single OFDM symbol.

11. The media of claim 10 further configured to estimate a frequency bin corresponding to each of the carrier frequency, the first tone and the second tone.

* * * * *